United States Patent
Kagawa et al.

(10) Patent No.: US 11,864,355 B2
(45) Date of Patent: Jan. 2, 2024

(54) THERMAL CONDUCTOR AND METHOD FOR MANUFACTURING THERMAL CONDUCTOR

(71) Applicant: SHOWA MARUTSUTSU COMPANY, LTD., Osaka (JP)

(72) Inventors: Katsuhiko Kagawa, Higashi-Osaka (JP); Takayuki Yamaguchi, Higashi-Osaka (JP)

(73) Assignee: SHOWA MARUTSUTSU COMPANY, LTD., Osaka (JP)

( * ) Notice: Subject to any disclaimer, the term of this patent is extended or adjusted under 35 U.S.C. 154(b) by 29 days.

(21) Appl. No.: 17/923,149

(22) PCT Filed: May 28, 2021

(86) PCT No.: PCT/JP2021/020410
§ 371 (c)(1),
(2) Date: Nov. 3, 2022

(87) PCT Pub. No.: WO2021/256220
PCT Pub. Date: Dec. 23, 2021

(65) Prior Publication Data
US 2023/0328929 A1    Oct. 12, 2023

(30) Foreign Application Priority Data

Jun. 19, 2020   (JP) ................................ 2020-106514

(51) Int. Cl.
*H05K 7/20*   (2006.01)
(52) U.S. Cl.
CPC ........ *H05K 7/2039* (2013.01); *F28F 2255/02* (2013.01); *F28F 2275/025* (2013.01)
(58) Field of Classification Search
CPC ................ H05K 7/2039; F28F 2255/02; F28F 2275/025
See application file for complete search history.

(56) References Cited

U.S. PATENT DOCUMENTS 9,777,205 B2   10/2017   Yang et al.
10,453,587 B2 *  10/2019  Wakamori ............... H01B 5/00
(Continued)

FOREIGN PATENT DOCUMENTS

EP       3934377 A1 *  1/2022 ............. B60S 1/026
JP    2009-55021 A    3/2009
(Continued)

OTHER PUBLICATIONS

International Search Report issued in PCT/JP2021/020410 (2 Pages) dated Aug. 24, 2021.

*Primary Examiner* — Gordon A Jones
(74) *Attorney, Agent, or Firm* — Finnegan, Henderson, Farabow, Garrett & Dunner, LLP

(57) ABSTRACT

A thermal conductor includes a plurality of thermal conducting portions; and joint portions made of a material having flexibility and configured to join the respective thermal conducting portions with each other, having voids where neither the thermal conducting portion nor the joint portion is present, and satisfying a condition of $0.5 \leq [(S1-S0)/S0] \times 100 \leq 20$ when an area of the thermal conductor in a planar view in a first direction is expressed by S0 [cm$^2$] and an area of the thermal conductor in the planar view in the first direction in a pressed state that the thermal conductor is pressed by 0.2 MPa in the first direction is expressed by S1 [cm$^2$]. Accordingly, the thermal conductor satisfies both ensuring adhesiveness to a member in contact with the thermal conductor in use and suppressing excessive deformation of the thermal conductor in a compressed state.

18 Claims, 16 Drawing Sheets

(56) References Cited

U.S. PATENT DOCUMENTS

2018/0023904 A1* 1/2018 Kato ................. B32B 27/38
                                                                                     165/80.2
2022/0080704 A1* 3/2022 Osanai ............... B23K 1/19

FOREIGN PATENT DOCUMENTS

| JP | 2017-141464 A | 8/2017 |
| JP | 2017-530220 A | 10/2017 |
| WO | WO 2017/086487 A1 | 5/2017 |

* cited by examiner

DEFORMATION

DEFORMATION

THERMAL CONDUCTOR AND METHOD FOR MANUFACTURING THERMAL CONDUCTOR

TECHNICAL FIELD

The present disclosure relates to a thermal conductor and a manufacturing method of the thermal conductor.

BACKGROUND

Recently there has been an urgent need to take heat release measures against heat generating members, such as electronic equipment, headlights for vehicles, and on-vehicle batteries. The amount of heat generation tends to increase accompanied with size reduction and high integration of electronic components, for example, central processing units of computers, arithmetic processors for image processing, SoCs of smartphones, DSPs and microcomputers of embedded devices, semiconductor elements such as transistors, luminous bodies such as light emitting diodes, electroluminescence and liquid crystal. The heat generation of these electronic components causes problems of reduced life and malfunction of the apparatus or the system. There has accordingly been a growing demand year by year for taking heat release measures against such electronic components.

Measures taken against high temperature members, such as these heat generating members, include using a heat release member such as a heat release fin made of a metal or a Peltier element, in addition to forcible cooling using a cooling fan. Grease is generally applied on such a heat release member, with a view to preventing an air layer serving as a heat insulating layer from being formed at an interface on a surface thermally connecting with a heat generating element. Conventional grease, however, does not have high thermal conductivity. Diamond grease with diamond particles dispersed therein has a relatively high thermal conductivity and is accordingly used in some cases (as described in, for example, Patent Literature 1).

The diamond grease is, however, expensive. Moreover, even using the diamond grease still has a difficulty in obtaining the sufficient thermal conductivity.

In the case where a thermal conductor is placed between the high temperature member and the heat release member in an electronic component as described above, the thermal conductor may be placed in a compressed state under application of a pressure. This improves the adhesiveness of the thermal conductor to the high temperature member and the heat release member, reduces the interfacial thermal resistance and enhances the actual thermal conductivity.

In order to improve the adhesiveness of the thermal conductor to the high temperature member and the heat release member, it is preferable that the thermal conductor is made of a relatively soft material.

The excessive softness of the thermal conductor, however, causes a problem that the thermal conductor is excessively deformed when being pressed and an extended portion of the thermal conductor comes into contact with exposed wiring or the like to cause an electrical short circuit of the wiring.

The thermal conductor made of a relatively hard material has little deformation when being pressed and prevents the occurrence of the problem of an electrical short circuit by the extended portion as described above. It is, however, difficult to provide this thermal conductor with sufficient adhesiveness to the high temperature member and the heat release member.

CITATION LIST

Patent Literature

Patent Literature 1: JP 2017-530220A

SUMMARY

Technical Problem

One object of the present disclosure is to provide a thermal conductor that satisfies both ensuring the adhesiveness to a member in contact with the thermal conductor in use and suppressing an excessive deformation of the thermal conductor in a compressed state, as well as a manufacturing method of a thermal conductor that manufactures, with high efficiency, a thermal conductor that satisfies both ensuring the adhesiveness to a member in contact with the thermal conductor in use and suppressing an excessive deformation of the thermal conductor in a compressed state.

Solution to Problem

According to one aspect of the present disclosure, there is provided a thermal conductor comprising a plurality of thermal conducting portions; and joint portions made of a material having flexibility and configured to join the respective thermal conducting portions with each other, having voids where neither the thermal conducting portion nor the joint portion is present, and satisfying a condition of $0.5 \leq [(S1-S0)/S0] \times 100 \leq 20$ when an area of the thermal conductor in a planar view in a first direction is expressed by $S0$ [cm$^2$] and an area of the thermal conductor in the planar view in the first direction in a pressed state that the thermal conductor is pressed by 0.2 MPa in the first direction is expressed by $S1$ [cm$^2$].

According to one aspect of the present disclosure, the thermal conductor may have a sheet-like form.

According to one aspect of the present disclosure, the thermal conductor may have a thickness of not less than 0.15 mm and not greater than 20 mm.

According to one aspect of the present disclosure, at least part of the plurality of thermal conducting portions may be provided to be continuous inside of the thermal conductor and may be exposed on each of two different surfaces of the thermal conductor.

According to one aspect of the present disclosure, the thermal conductor may have at least a pair of parallel surfaces, wherein at least part of the plurality of thermal conducting portions may be penetrating thermal conducting portions that are provided to be continuous inside of the thermal conductor and that are exposed on each of the pair of parallel surfaces, and an angle between a normal direction of the pair of parallel surfaces and an extending direction of the penetrating thermal conducting portions may be not less than 3° and not greater than 45°.

According to one aspect of the present disclosure, a proportion of the thermal conducting portions occupied in the thermal conductor may be not lower than 15% by volume and not higher than 80% by volume.

According to one aspect of the present disclosure, a proportion of the joint portions occupied in the thermal conductor may be not lower than 15% by volume and not higher than 70% by volume.

According to one aspect of the present disclosure, a proportion of the voids occupied in the thermal conductor may be not lower than 5% by volume and not higher than 65% by volume.

According to one aspect of the present disclosure, the thermal conductor may satisfy a relationship of 25≤[(VJ+VV)/(VC+VJ+VV)]×100≤90, when a proportion of the thermal conducting portions occupied in the thermal conductor is expressed by VC [% by volume], a proportion of the joint portions occupied in the thermal conductor is expressed by VJ [% by volume] and a proportion of the voids occupied in the thermal conductor is expressed by VV [% by volume].

According to one aspect of the present disclosure, the thermal conducting portions may be made of a graphite-containing material.

According to one aspect of the present disclosure, the thermal conducting portions may be substantially composed of a single component.

According to one aspect of the present disclosure, the plurality of thermal conducting portions may be arranged in an island-like pattern in the planar view in the first direction.

According to one aspect of the present disclosure, the plurality of thermal conducting portions may be arranged in stagger in the planar view in the first direction.

According to one aspect of the present disclosure, an interval between adjacent thermal conducting portions in the planar view in the first direction may be not less than 1 μm and not greater than 200 μm.

According to one aspect of the present disclosure, the thermal conductor may have a density of not lower than 0.6 g/cm$^3$ and not higher than 2.5 g/cm$^3$ in a state prior to the pressed state.

According to one aspect of the present disclosure, the thermal conductor may satisfy a condition of 5≤[(S3−S4)/S3]×100≤50, when an area of the thermal conductor in the planar view in a second direction that is perpendicular to the first direction is expressed by S3 [cm$^2$] and an area of the thermal conductor observed in the second direction in the pressed state that the thermal conductor is pressed by 0.2 MPa in the first direction is expressed by S4 [cm$^2$].

According to one aspect of the present disclosure, the thermal conductor may satisfy a relationship of 0.70≤L1/L0, when a length of the thermal conductor in the first direction in an initial state is expressed by L0 [mm] and a length of the thermal conductor in the first direction when an operation of pressing the thermal conductor in the first direction by 1.0 MPa for one minute and releasing the thermal conductor from the pressed state to leave the thermal conductor in the released state for one minute is repeated 1000 number of times is expressed by L1 [mm].

According to one aspect of the present disclosure, the thermal conductor may have an observed value of thermal conductivity in the first direction in the pressed state that the thermal conductor is pressed by 0.2 MPa in the first direction is not lower than 50 W/(m·K).

According to another aspect of the present disclosure, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a thermal conducting portion-forming member that is used to form the thermal conducting portions; and a joint portion-forming composition adhesion process of making a joint portion-forming composition that is used to form the joint portions, adhere to a surface of the thermal conducting portion-forming member, wherein the thermal conductor has voids where neither the thermal conducting portion nor the joint portion is present, and wherein when an area of the thermal conductor in a planar view in a first direction is expressed by S0 [cm$^2$] and an area of the thermal conductor in the planar view in the first direction in a pressed state that the thermal conductor is pressed by 0.2 MPa in the first direction is expressed by S1 [cm$^2$], the thermal conductor to be manufactured satisfies a condition of 0.5≤[(S1−S0)/S0]×100≤20.

According to one aspect of the present disclosure, the joint portion-forming composition adhesion process may cause air bubbles to be included between the thermal conducting portion-forming member and the joint portion-forming composition.

According to one aspect of the present disclosure, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a long thermal conducting portion-forming member that is used to form the thermal conducting portions; a joint portion-forming composition adhesion process of making a joint portion-forming composition that is used to form the joint portions, adhere to a surface of the thermal conducting portion-forming member; a winding process of winding the thermal conducting portion-forming member with the joint portion-forming composition adhering thereto, on a peripheral surface of a roll by traverse winding to obtain a wound body in a tubular shape; and a cutting process of cutting open the wound body in a direction that is not perpendicular to an axial direction of the roll to obtain a cut body.

According to one aspect of the present disclosure, the thermal conducting portion-forming member may have a belt-like form having irregularity on a main surface thereof.

According to one aspect of the present disclosure, the thermal conducting portion-forming member may include a fiber bundle extended in a longitudinal direction of the thermal conducting portion-forming member.

According to one aspect of the present disclosure, the winding process may wind a plurality of the thermal conducting portion-forming members with the joint portion-forming composition adhering thereto, on a peripheral surface of one roll to obtain one wound body.

According to one aspect of the present disclosure, the joint portion-forming composition may include a hardening resin material. The manufacturing method of the thermal conductor may further comprise a curing process of curing the hardening resin material included in the cut body, after the cutting process.

According to one aspect of the present disclosure, the hardening resin material may generate a gas in the curing process.

The present disclosure provides a thermal conductor that satisfies both ensuring the adhesiveness to a member in contact with the thermal conductor in use and suppressing an excessive deformation of the thermal conductor in a compressed state, as well as a manufacturing method of a thermal conductor that manufactures, with high efficiency, a thermal conductor that satisfies both ensuring the adhesiveness to a member in contact with the thermal conductor in use and suppressing an excessive deformation of the thermal conductor in a compressed state.

DESCRIPTION OF EMBODIMENTS

Preferred embodiments of the present disclosure are described in detail below.

1. Thermal Conductor

Figure 1:
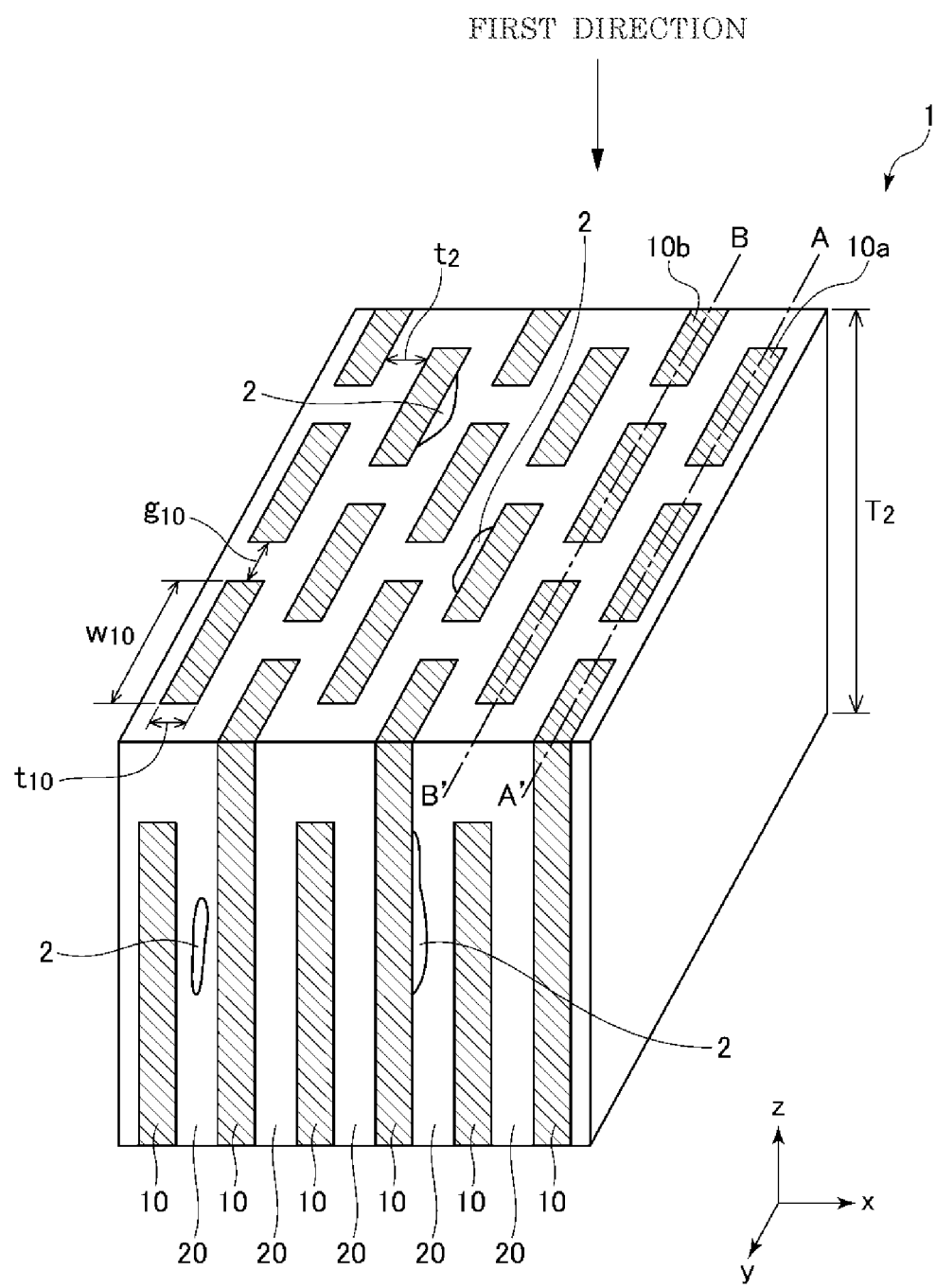
FIG. 1 is a perspective view schematically illustrating one example of a thermal conductor according to the present disclosure.
Figure 2A:
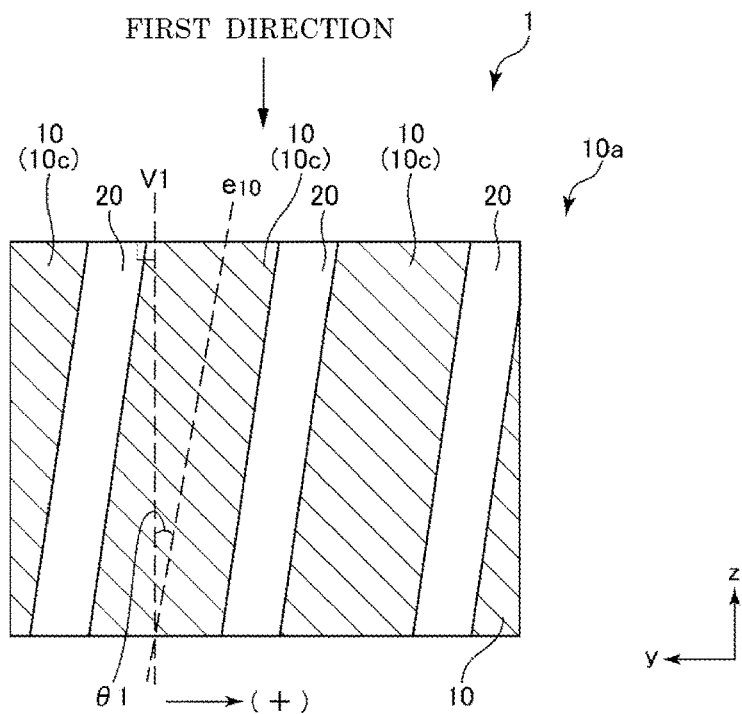
FIG. 2A is a vertical sectional view illustrating the thermal conductor shown in FIG. 1.
Figure 2B:
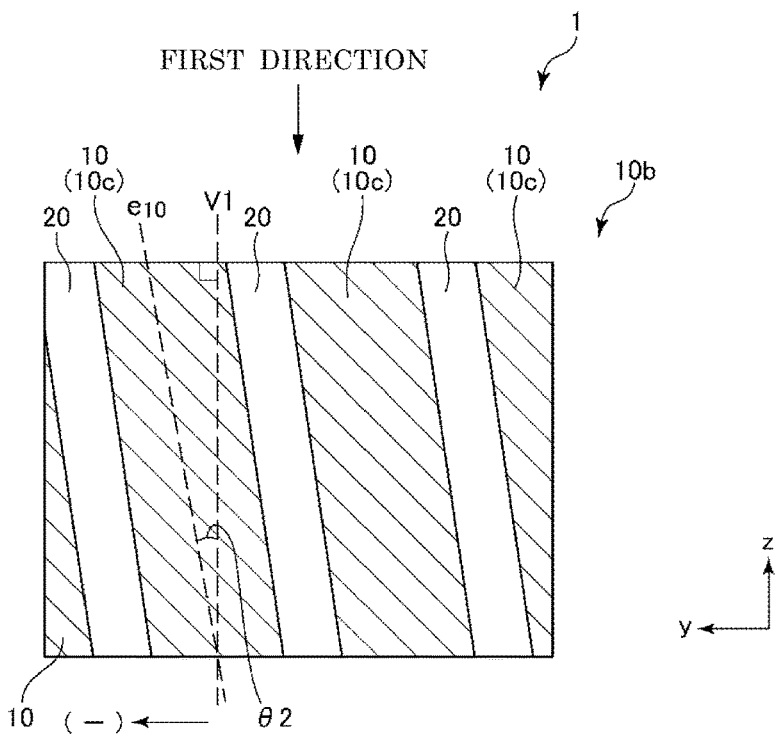
FIG. 2B is another vertical sectional view illustrating the thermal conductor shown in FIG. 1.
Figure 3A:
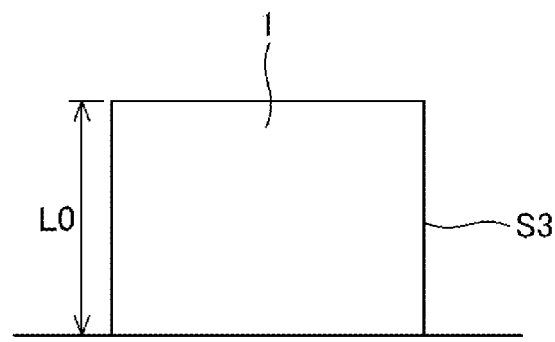
FIG. 3A is a side view schematically illustrating the thermal conductor in a natural state.
Figure 3B:
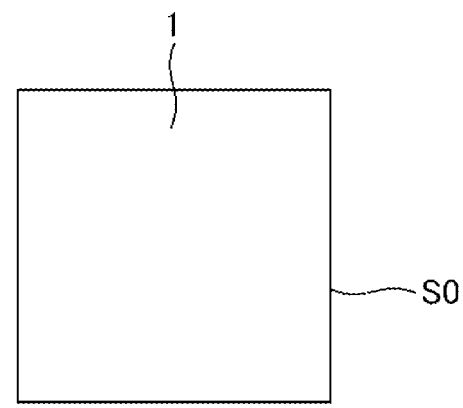
FIG. 3B is a top view schematically illustrating the thermal conductor in a natural state.
Figure 4A:
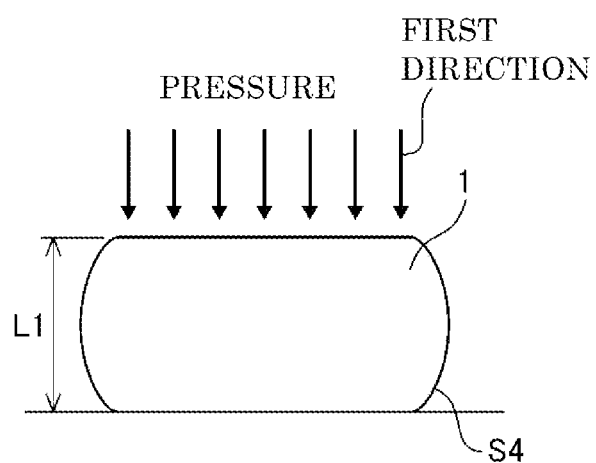
FIG. 4A is a side view schematically illustrating the thermal conductor in a pressed state that the thermal conductor is pressed in the first direction.
Figure 4B:
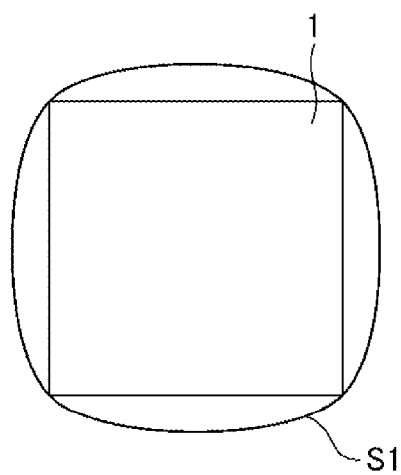
FIG. 4B is a top view schematically illustrating the thermal conductor in a pressed state that the thermal conductor is pressed in the first direction.
Figure 5:
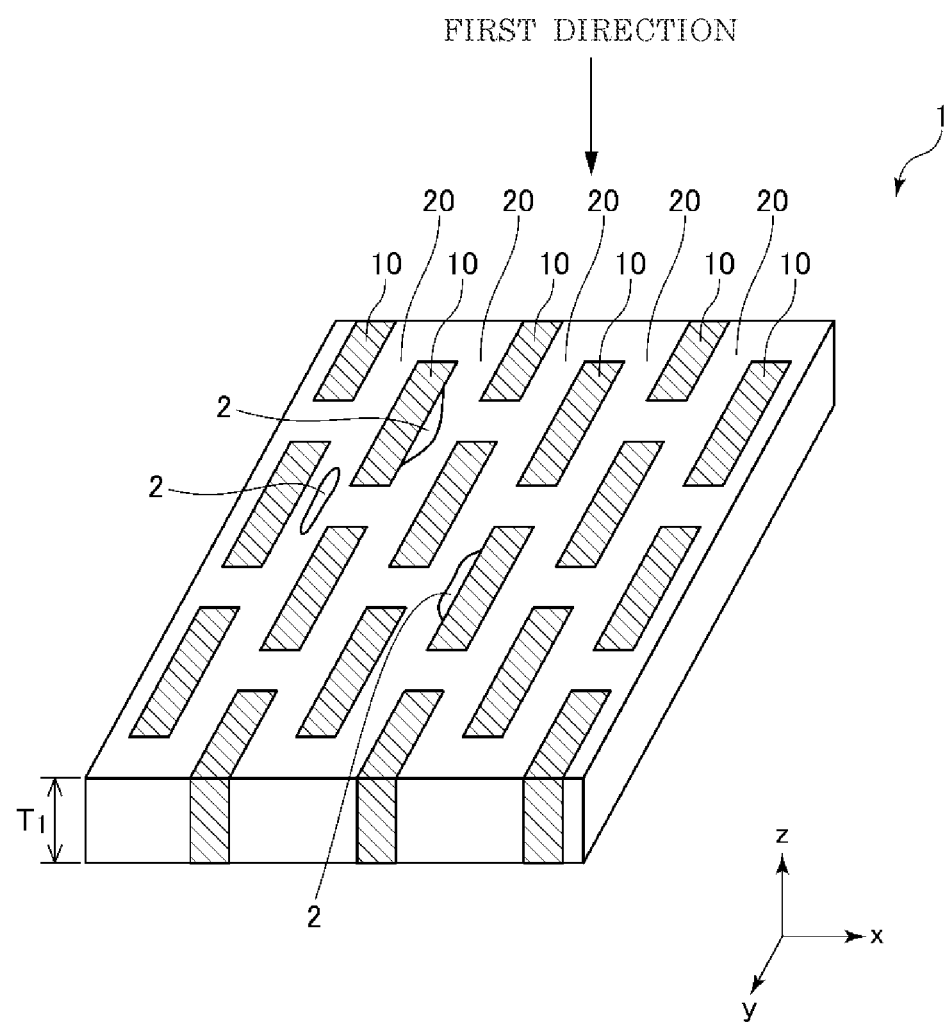
FIG. 5 is a perspective view schematically illustrating another example of the thermal conductor according to the present disclosure.
Figure 6A:
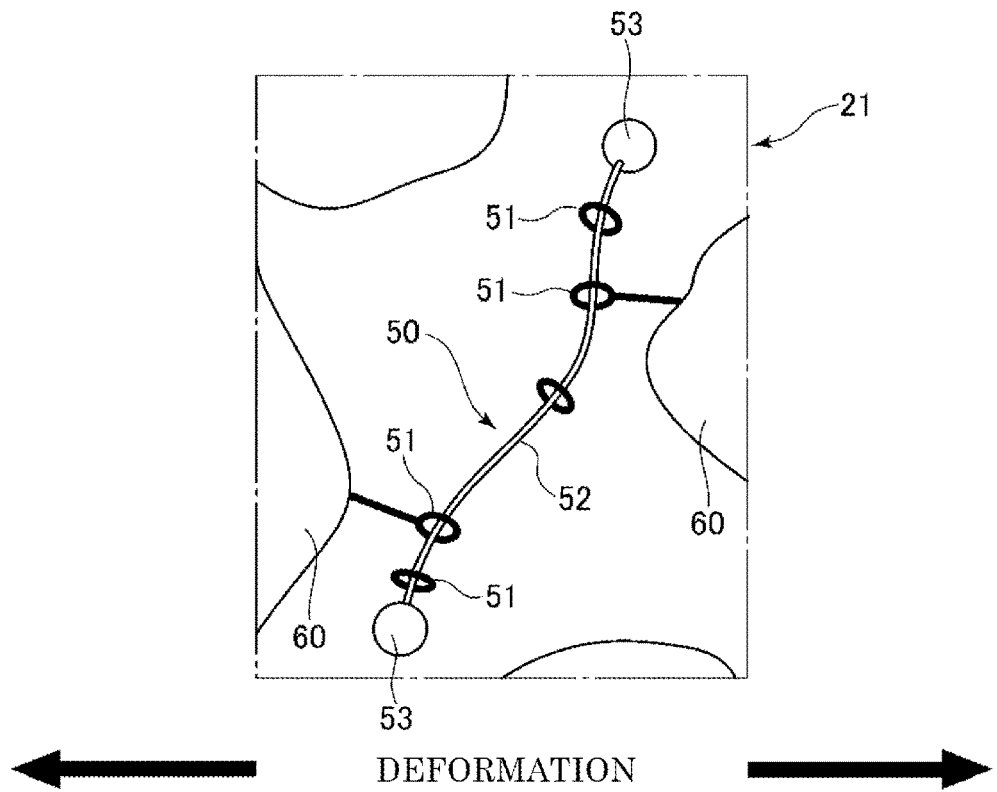
FIG. 6A is a conceptual diagram illustrating one example of a resin material constituting joint portions.
Figure 6B:
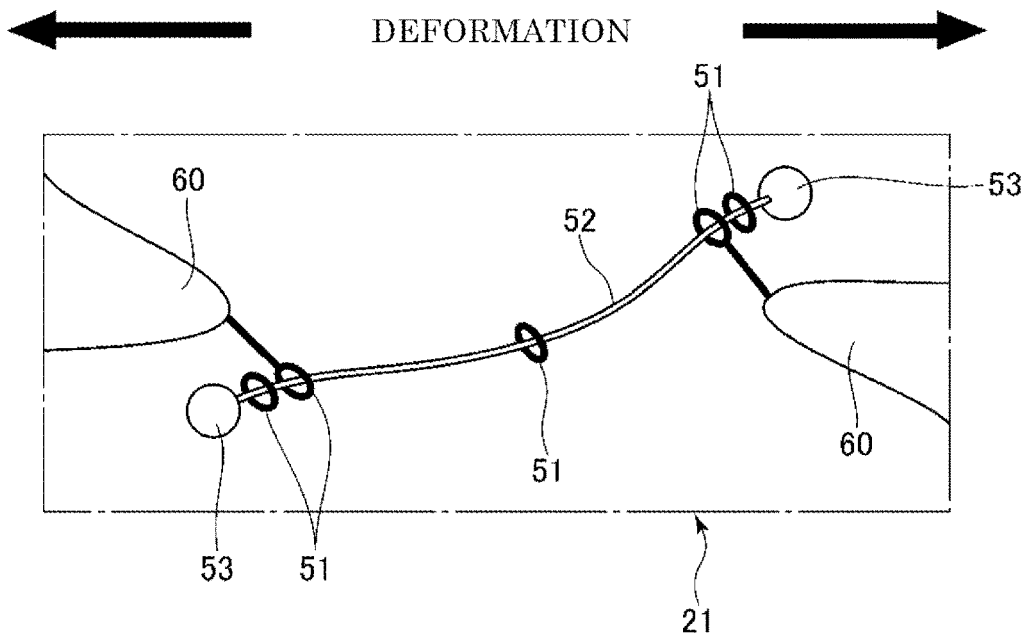
FIG. 6B is a conceptual diagram illustrating one example of a resin material constituting joint portions after deformation.

A thermal conductor according to the present disclosure is described first. FIG. 1 is a perspective view schematically illustrating one example of a thermal conductor according to the present disclosure. FIG. 2A and FIG. 2B are vertical sectional views illustrating the thermal conductor shown in FIG. 1. FIG. 2A is a sectional view taken on a cutting line A-A', and FIG. 2B is a sectional view taken on a cutting line B-B'. FIG. 3A is a side view schematically illustrating the thermal conductor in a natural state. FIG. 3B is a top view schematically illustrating the thermal conductor in a natural state. FIG. 3A is a side elevation viewed in a first direction, and FIG. 3B is a top plan viewed in a second direction. FIG. 4A is a side view schematically illustrating the thermal conductor in a pressed state that the thermal conductor is pressed in the first direction. FIG. 4B is a top view schematically illustrating the thermal conductor in a pressed state that the thermal conductor is pressed in the first direction. FIG. 4A is a side elevation viewed in the first direction, and FIG. 4B is a top plan viewed in the second direction. FIG. 5 is a perspective view schematically illustrating another example of the thermal conductor according to the present disclosure. FIG. 6A and FIG. 6B are conceptual diagrams illustrating one example of a resin material constituting joint portions.

In the specification hereof, the "natural state" denotes a state without application of any external force other than the gravity and more specifically denotes a state having no record of application of any external force other than the gravity within 24 hours. It is preferable that the thermal conductor has no record of application of any stress of not smaller 0.1 MPa after manufacture of the thermal conductor.

In the drawings referred to in the specification hereof, some parts may be reduced or enlarged in illustration with a view to clarifying relationships between respective members. The ratio of the sizes of the respective members shown in the drawings does not represent the ratio of the actual sizes of the respective members.

The measurements and the processes described in the specification hereof were performed at 20° C., unless another temperature condition is specified.

As described later in detail, the thermal conductor 1 has excellent thermal conductivity in a predetermined direction and is used, for example, by bringing a member to be cooled down or the like into contact with the thermal conductor 1.

As shown in FIG. 1, FIG. 2A and FIG. 2B, the thermal conductor 1 includes a plurality of thermal conducting portions 10 and joint portions 20 made of a material having flexibility and configured to join the respective thermal conducting portions 10 with each other. The thermal conductor 1 also has voids 2 where neither the thermal conducting portion 10 nor the joint portion 20 is present.

As shown in FIG. 3A, FIG. 3B, FIG. 4A, and FIG. 4B, when the area of the thermal conductor 1 in a planar view in a first direction is expressed by S0 [cm$^2$] and the area of the thermal conductor 1 in the planar view in the first direction in a pressed state that the thermal conductor 1 is pressed by 0.2 MPa in the first direction is expressed by S1 [cm$^2$], the thermal conductor 1 according to the present disclosure satisfies a condition of $0.5 \leq [(S1-S0)/S0] \times 100 \leq 20$.

In the present disclosure, the "first direction" is any arbitrary direction. In the following description, the first direction is mainly a vertical direction in FIG. 1, and an upward direction from bottom to top of FIG. 1 is a Z direction. The second direction is any direction perpendicular to the first direction and includes an X direction and a Y direction shown in FIG. 1. In the description below, a normal direction of a plane having the largest area out of planes of the thermal conductor is specified as the first direction. In the case where the thermal conductor 1 is pressed from a top face thereof, S0 and S1 denote areas of the thermal conductor 1 observed from the top face, and S1' described later also denotes an area of the thermal conductor 1 observed from the top face. In the case where the thermal conductor 1 is pressed from the top face thereof, S3 and S4 described later denote areas of the thermal conductor 1 observed from a side face thereof. When the first direction is the vertical direction, L0 and L1 described later denote heights (thicknesses) of the thermal conductor 1.

The thermal conducting portions 10 and the joint portions 20 included in the thermal conductor 1 are omitted from the illustration of FIG. 3A, FIG. 3B, FIG. 4A and FIG. 4B. The same applies to FIG. 13 and FIG. 14 described later. A predetermined pressurizing jig, for example, two flat plates, is used to press the thermal conductor 1 but is also omitted from the illustration of FIG. 4A and FIG. 4B.

As shown in FIG. 3A, FIG. 3B, FIG. 4A and FIG. 4B, pressing the thermal conductor 1 in the first direction deforms the thermal conductor 1. In other words, pressing the thermal conductor 1 reduces the height of the thermal conductor 1, while expanding the thermal conductor 1 in a planar direction (the X direction and the Y direction). This is so-called a pressed-down state. More specifically, in the planar view in the first direction, the area S1 of the thermal conductor 1 in the pressed state is larger than the area S0 of the thermal conductor 1 in the natural state.

With regard to measurements described in the specification hereof, in the case of pressing the thermal conductor in the first direction, the thermal conductor is pressed by a flat surface of a pressing member that has an area larger than the size of the thermal conductor, as an object to be measured, even in the pressed state or more specifically larger than the area of the thermal conductor in planar view in the first direction.

When a surface of the thermal conductor 1, as the object to be measured, having a normal in the first direction has dimensions of a square of 40 mm×40 mm or dimensions including this square, measurement of the values S0 and S1 may be performed with adjustment of the dimensions and the shape of the thermal conductor to be a rectangular parallelopiped having the square of 40 mm×40 mm as the surface having the normal in the first direction.

In the following description, the value of "$[(S1-S0)/S0]\times 100$" is defined as "amount of extrusion".

The amount of extrusion in the above value range provides a thermal conductor that satisfies both ensuring the adhesiveness to a member in contact with the thermal conductor in use and suppressing an excessive deformation of the thermal conductor in a compressed state. Accordingly, this provides the thermal conductor 1 with appropriate flexibility and suppresses the thermal conductor 1 from being excessively deformed when being pressed, for example, effectively prevents an extruded part from unintentionally coming into contact with another member such as an electronic component or a wiring part in the pressed state of the thermal conductor 1, while ensuring the high adhesiveness to a member which the thermal conductor 1 is applied to (for example, a member to be cooled down) and improving the actual thermal conductivity between this member and the thermal conductor 1. This configuration thus effectively cools down the member which the thermal conductor 1 is applied to, while effectively preventing the occurrence of a problem, such as an electrical short circuit.

More specifically, the thermal conductor 1 according to the present disclosure has the voids 2 where neither the thermal conducting portion 10 nor the joint portion 20 is present. These voids 2 serve as cushions and absorb deformation of the thermal conductor 1 or more specifically absorb deformation of the joint portions 20 when the thermal conductor 1 is pressed. Accordingly, this configuration suppresses the entire thermal conductor 1 from being excessively deformed. Furthermore, this configuration provides the thermal conductor 1 with the appropriate flexibility and enables the thermal conductor 1 to be appropriately adjusted such as to satisfy the above conditions.

The thermal conductor that does not satisfy the above conditions, on the other hand, fails to provide the satisfactory results. For example, the thermal conductor without voids is not allowed to absorb deformation when the thermal conductor is pressed. This increases the amount of extrusion in the pressed state of the thermal conductor and fails to sufficiently prevent the occurrence of the problem described above.

The value of "$[(S1-S0)/S0]\times 100$" lower than the lower limit value given above provides the thermal conductor with insufficient flexibility and fails to provide the sufficient adhesiveness to the member which the thermal conductor is applied to.

The value of "$[(S1-S0)/S0]\times 100$" higher than the upper limit value described above, on the other hand, causes the thermal conductor to be excessively deformed in the pressed state. This is likely to cause the thermal conductor to come into contact with an unintentional location and to cause a problem such as an electrical short circuit.

As described above, the thermal conductor 1 according to the present disclosure satisfies the condition of $0.5 \leq [(S1-S0)/S0]\times 100 \leq 20$. The thermal conductor 1 according to the present disclosure preferably satisfies a condition of $1.0 \leq [(S1-S0)/S0]\times 100 \leq 15$, more preferably satisfies a condition of $1.5 \leq [(S1-S0)/S0]\times 100 \leq 10$ and furthermore preferably satisfies a condition of $2.0 \leq [(S1-S0)/S0]\times 100 \leq 8.0$.

This configuration makes the advantageous effects of the present disclosure described above more prominent.

The amount of extrusion of the thermal conductor 1 may suitably be regulated, for example, by appropriately adjusting the proportion of the thermal conducting portions 10, the proportion of the joint portions 20 and the proportion of the voids 2 occupied in the thermal conductor 1 or by appropriately setting the flexibility of the joint portions 20, in other words, by appropriately selecting the material of the joint portions 20.

When the area of the thermal conductor 1 in the planar view in the first direction is expressed by S0 [cm$^2$] and the area of the thermal conductor 1 in the planar view in the first direction in a pressed state that the thermal conductor 1 is pressed by a predetermined pressure in the first direction to have a compression rate of 20% in a thickness direction is expressed by S1' [cm$^2$], the thermal conductor 1 preferably satisfies a condition of $1.0 \leq [(S1'-S0)/S0]\times 100 \leq 15$, more preferably satisfies a condition of $1.5 \leq [(S1'-S0)/S0]\times 100 \leq 10$ and furthermore preferably satisfies a condition of $2.0 \leq [(S1'-S0)/S0]\times 100 \leq 8.0$.

This configuration makes the advantageous effects of the present disclosure described above more prominent.

The thermal conductor 1 has a sheet-like form in a configuration shown in FIG. 5.

The thermal conductor 1 of the sheet-like form is allowed to be suitably curved as a whole and remarkably improves the actual thermal conductivity, for example, in application of the thermal conductor 1 to a member having a surface of a relatively small planar portion or a relatively small curvature, while reducing the volume of the thermal conductor 1. The term "planar portion" herein is a concept including a surface with minute irregularities. Even when the member which the thermal conductor 1 is applied to has irregularities or the like on a surface thereof, the thermal conductor 1 is more suitably allowed to microscopically adhere to the entire surface of the member which the thermal conductor 1 is applied to. In other words, this configuration ensures the better contact in a microscopic region between the thermal conductor 1 and the member which the thermal conductor 1 is applied to. This significantly improves the thermal dissipation, for example, in the case where the member which the thermal conductor 1 is applied to is a heat-generating member. Furthermore, this configuration enables the thermal conductor 1 to be suitably positioned in use, even when a space where the thermal conductor 1 is positioned (a clearance between a plurality of members that come into contact with the thermal conductor 1) is narrow.

In the thermal conductor 1 of the sheet-like form, the thickness of the thermal conductor 1 in the natural state, i.e., a length shown by $T_1$ in FIG. 5, is preferably not less than 0.15 mm and not greater than 20 mm, is more preferably not less than 0.20 mm and not greater than 10 mm, and is furthermore preferably not less than 0.25 mm and not greater than 5 mm.

This configuration enables the thermal conductor 1 of the sheet-like form to more suitably follow the surface profile of a member which the thermal conductor 1 is applied to and makes the advantageous effects described above more prominent.

The thermal conductor 1 has a block-like form in the configuration shown in FIG. 1.

The thermal conductor 1 according to the present disclosure is not limited to the sheet-like form but may be in any shape.

For example, even when the member which the thermal conductor 1 is applied to has a complicated surface profile, the thermal conductor 1 of the block-like form is suitably allowed to closely adhere to this member and remarkably improves the actual thermal conductivity. Furthermore, this configuration enables the thermal conductor 1 to suitably adhere to the member which the thermal conductor 1 is applied to in a three-dimensional manner. Accordingly, the thermal conductor 1 is thus favorably applicable to this member even when an area of the member required to come into contact with the thermal conductor 1 is a relatively wide area in three-dimensional directions.

In the thermal conductor 1 of the block-like form, the thickness of the thermal conductor 1 in the natural state, i.e., a length shown by $T_2$ in FIG. 1 is preferably not less than 30 mm and not greater than 200 mm, is more preferably not less than 50 mm and not greater than 150 mm, and is furthermore preferably not less than 70 mm and not greater than 120 mm.

The thermal conductor 1 of the block-like form is favorably used to cool down a relatively large component, for example, a motor.

In the drawings referred to in the specification hereof, clear interfaces are illustrated between the thermal conducting portions 10 and the joint portions 20. The interfaces between the thermal conducting portions 10 and the joint portions may, however, be unclear, for example, as part of the thermal conducting portion 10 enters the joint portion 20.

1-1. Thermal Conducting Portion

The plurality of thermal conducting portions 10 are portions mainly contributing to the thermal conductivity of the entire thermal conductor 1 or more specifically the thermal conductivity in an extending direction of the thermal conducting portions 10.

In the specification hereof, an extending direction of a thermal conducting portion-forming member 10' described later in detail is defined as the extending direction of the thermal conducting portions 10. For example, in the configuration shown in FIG. 1, a direction of a YZ plane is the extending direction of the thermal conducting portions 10. A lateral depth direction in FIG. 7 described later is the extending direction of the thermal conducting portion-forming member 10' and the extending direction of the thermal conducting portions 10.

As shown in FIG. 1, it is preferable that a plurality of thermal conducting portions 10 are provided in an island-like pattern in the planar view in the first direction.

This configuration readily provides the thermal conductor 1 with the higher overall flexibility, while reducing a difference in thermal conductivity among respective in-plane (direction of an XY plane shown in FIG. 1) locations of the thermal conductor 1. This configuration more definitely makes the advantageous effects of the present disclosure described above more prominent.

The term "island-like pattern" in the specification hereof denotes a state that the plurality of thermal conducting portions 10 are not continuous with each other but are scattered between the joint portions 20. In other words, each thermal conducting portion 10 is isolated from other thermal conducting portions both in an X direction and in a Y direction.

In the thermal conductor 1 shown in FIG. 1, a plurality of thermal conducting portions 10 are arranged in a staggered pattern in the planar view in the first direction. In other words, first lines 10a and second lines 10a where a plurality of thermal conducting portions 10 are arrayed in the Y direction are alternately arranged in the X direction, such that the thermal conducting portions 10 are alternating with each other.

This configuration makes the advantageous effects described above more prominent.

It is preferable that the thermal conducting portions 10 in the first line and the thermal conducting portions 10 in the second line 10b at least partly overlap with each other in the X direction.

This configuration further makes the advantageous effects described above more prominent.

A width of the thermal conducting portion 10 shown by $w_{10}$ in FIG. 1 in the planar view in the first direction is preferably not less than 1 mm and not greater than 30 mm, is more preferably not less than 5 mm and not greater than mm, and is furthermore preferably not less than 7 mm and not greater than mm.

A thickness of the thermal conducting portion 10 shown by $t_{10}$ in FIG. 1 is preferably not less than 5 μm and not greater than 500 μm and is more preferably not less than 10 μm and not greater than 200 μm.

This configuration ensures the sufficiently high proportion of the thermal conducting portions 10 occupied in the thermal conductor 1 and provides the thermal conductor 1 with the higher overall flexibility. This configuration thus more definitely makes the advantageous effects of the present disclosure described above more prominent.

An interval between adjacent thermal conducting portions 10 shown by $g_{10}$ in FIG. 1 the planar view of the thermal conductor 1 in the first direction is preferably not less than 1 μm and not greater than 2000 μm, is more preferably not less than 2 μm and not greater than 1500 μm, and is furthermore preferably not less than 3 μm and not greater than 1000 μm.

This configuration ensures the sufficiently high proportion of the thermal conducting portions 10 occupied in the thermal conductor 1 and provides the thermal conductor 1 with the higher overall flexibility. This configuration thus makes the advantageous effects of the present disclosure described above more prominent. The interval between adjacent thermal conducting portions 10 shown by $g_{10}$ in FIG. 1 is, however, not essential. In other words, the interval $g_{10}$ may be equal to zero. In this case, for example, the adjacent thermal conducting portions 10 may come into contact with each other by respective side faces thereof. At least part of the plurality of flat thermal conducting portions 10 may overlap with each other, such that the thermal conducting portions 10 partly come into contact with each other in the width direction.

The "interval between adjacent thermal conducting portions 10" in the specification hereof means a gap as s shortest distance between adjacent thermal conducting portions 10.

The plurality of thermal conducting portions 10 are arranged in the staggered pattern in the illustrated example of FIG. 1 but may be arranged in a different pattern other than the staggered pattern. The plurality of thermal conducting portions 10 may be arranged in a regular manner or may be arranged at random.

It is preferable that at least part of the plurality of thermal conducting portions 10 are provided to be continuous inside of the thermal conductor 1 or more specifically to be extended continuously inside of the thermal conductor 1 with regard to the pressing direction (the first direction) in use of the thermal conductor 1 and are exposed on two different faces of the thermal conductor. These two different faces may come into contact with another or other members in this pressing direction in use of the thermal conductor 1 preferably.

This configuration accordingly enhances the actual thermal conductivity with regard to the above direction.

More specifically, the thermal conductor 1 of the illustrated configuration has at least one pair of parallel surfaces, and at least part of the plurality of thermal conducting portions 10 are penetrating thermal conducting portions 10c that are provided to be continuous inside of the thermal conductor 1 and that are exposed on two parallel surfaces.

This configuration further enhances the actual thermal conductivity between the two parallel surfaces.

The term "parallel" in the specification hereof does not mean strict "parallelism" in a mathematical meaning but allows for a slight deviation.

In the thermal conductor 1 shown in FIG. 1, FIG. 2A and FIG. 2B, the penetrating thermal conducting portions 10c have an extending direction that is expressed by $e_{10}$ in FIG. 2A and FIG. 2B and that is inclined to a normal direction of the surface expressed by V1 shown in FIG. 2A and FIG. 2B. In other words, the extending direction of the penetrating thermal conducting portions 10c is inclined to the pressing direction (the first direction) in use of the thermal conductor 1.

For example, even when a relatively large load is applied to the thermal conductor 1, this configuration more effectively suppresses irreversible deformation of the thermal conductor 1, for example, collapse of the thermal conductor 1 due to buckling or the like, and improves the durability of the thermal conductor 1. Furthermore, when the thermal conductor 1 is compressed in the first direction, this configuration causes a surface pressure to be more readily applied to the thermal conductor 1 and further enhances the adhesiveness between the thermal conductor 1 and the member which the thermal conductor 1 is applied to. Moreover, the pressure applied to the thermal conductor 1 in the first direction includes a component of force in a direction of pressing the thermal conducting portions 10 against the joint portions 20. This configuration accordingly enhances the adhesiveness between the thermal conducting portions 10 and the joint portions 20.

As shown in FIG. 2A and FIG. 2B, the direction of inclination of the penetrating thermal conducting portions 10c to the normal direction V1 of the surface in the first line 10a of the thermal conducting portions 10 is opposite to that in the second line 10b.

The direction of inclination of the penetrating thermal conducting portions 10c in the first line 10a to the normal direction V1 of the surface is defined as a positive (+) direction, and the direction of inclination of the penetrating thermal conducting portions 10c in the second line 10b to the normal direction of the surface is defined as a negative (−) direction.

Accordingly, the penetrating thermal conducting portions 10c in the first line 10a are inclined by θ1 in the positive direction to the normal direction V1 of the surface, whereas the penetrating thermal conducting portions 10c in the second line 10b are inclined by θ2 in the negative direction to the normal direction V1 of the surface.

For example, even when a relatively large load is applied to the thermal conductor 1, the configuration of providing the penetrating thermal conducting portions 10c inclined in different directions or more specifically the configuration of providing the penetrating thermal conducting portions 10c inclined in the positive direction to the normal direction V1 of the surface and the penetrating thermal conducting portions 10c inclined in the negative direction to the normal direction V1 of the surface more effectively suppresses irreversible deformation of the thermal conductor 1, for example, collapse of the thermal conductor 1 due to buckling or the like, and further improves the durability of the thermal conductor 1. Furthermore, when the thermal conductor 1 is compressed in the first direction, this configuration causes the surface pressure to be more readily applied to the thermal conductor 1 and further enhances the adhesiveness between the thermal conductor 1 and the member which the thermal conductor 1 is applied to. Moreover, the pressure applied to the thermal conductor 1 in the first direction includes the component of force in the direction of pressing the thermal conducting portions 10 against the joint portions 20. This configuration accordingly enhances the adhesiveness between the thermal conducting portions and the joint portions 20.

Especially, the configuration of alternately arranging the penetrating thermal conducting portions 10c inclined in the positive direction to the normal direction V1 of the surface and the penetrating thermal conducting portions 10c inclined in the negative direction to the normal direction V1 of the surface makes the advantageous effects described above furthermore prominent.

As shown in FIG. 2A and FIG. 2B, the absolute values of the angles θ1 and θ2 between the normal direction V1 of the surface and the extending directions $e_{10}$ of the penetrating thermal conducting portions 10c are preferably not less than 3° and not greater than 45°, are more preferably not less than 5° and not greater than 40°, and are furthermore preferably not less than 8° and not greater than 35°.

When the thermal conductor 1 is compressed in the first direction, this configuration causes the surface pressure to be more readily applied to the thermal conductor 1 and further enhances the adhesiveness between the thermal conductor 1 and the member which the thermal conductor 1 is applied to. Moreover, the pressure applied to the thermal conductor 1 in the first direction includes the component of force in the direction of pressing the thermal conducting portions 10 against the joint portions 20. This configuration accordingly enhances the adhesiveness between the thermal conducting portions and the joint portions 20.

The angle θ1 and the angle θ2 may be different from each other but are preferably equal to each other.

The angle described above may not be a strict numerical value in a mathematical meaning but may include an ordinary error in the technical field of the present disclosure. For example, an angle having a difference of less than 1° is regarded as an identical angle including the difference as an error.

The angle of inclination of the thermal conducting portions 10 is not specifically limited. In the case of the thermal conducting portions 10 (the thermal conducting portion-forming member 10') in a belt-like form, it is preferable that a surface direction of the thermal conducting portions 10 is inclined to the normal direction V1 of the surface.

For example, even when a relatively large load is applied to the thermal conductor 1, this configuration more effectively suppresses irreversible deformation of the thermal conductor 1, for example, collapse of the thermal conductor 1 due to buckling or the like, and improves the durability of the thermal conductor 1. Furthermore, when the thermal conductor 1 is compressed in the first direction, this configuration causes a surface pressure to be more readily applied to the thermal conductor 1 and further enhances the adhesiveness between the thermal conductor 1 and the member which the thermal conductor 1 is applied to. Moreover, the pressure applied to the thermal conductor 1 in the first direction includes a component of force in a direction of pressing the thermal conducting portions 10 against the joint portions 20. This configuration accordingly enhances the adhesiveness between the thermal conducting portions 10 and the joint portions 20.

The material of the thermal conducting portions 10 is required to have thermal conductivity but is otherwise not specifically limited. Examples of the material constituting the thermal conducting portions 10 include ceramic materials such as aluminum nitride, boron nitride, silicon nitride, silicon carbide and alumina; carbon materials such as graphite and carbon fibers; and metal materials such as copper and aluminum. It is, however, preferable that the thermal conducting portions 10 are made of a carbon material, and it is more preferable that the thermal conducting portions 10 are made of a graphite-containing material.

This configuration furthermore enhances the actual thermal conductivity between the thermal conductor 1 and the member which the thermal conductor is applied to, while reducing the manufacturing cost of the thermal conductor 1.

1-1-1. Carbon Material

More specifically, the thermal conducting portions 10 made from the thermal conducting portion-forming member 10' including a carbon material, such as graphite or carbon fibers, additionally has the following advantageous effects, in addition to the advantageous effects described above. This configuration improves the ductility and the flexibility of the thermal conductor 1 and more specifically enhances, for example, the restoring force when the thermal conductor 1 is bent, the cushioning properties by the internal voids, and the improved contact performance by appropriate deformation when the thermal conductor 1 comes into contact with the member which the thermal conductor is applied to. These advantageous effects are especially prominent when graphite is used as the carbon material.

1-1-2. Metal Material

The thermal conducting portions 10 made from the thermal conducting portion-forming member 10' made of a metal material additionally has the following advantageous effects, in addition to the advantageous effects described above. This configuration reduces dusting of the thermal conductor 1 because of the high binding force inside of the metal material. This configuration also more effectively suppresses irreversible deformation of the thermal conductor 1, for example, collapse of the thermal conductor 1 due to buckling or the like, even when a relatively large load is applied to the thermal conductor 1.

Examples of the metal material constituting the thermal conducting portions 10 include a variety of single metals and alloys. The metal material may be one or a combination of two or more selected among these examples. The metal material preferably includes one metal or two or more metals selected from the group consisting of Al, Cu, Ag, Au, Mg and Zn.

This configuration further improves the thermal conductivity of the thermal conducting portions 10.

The alloy including some of the metal elements constituting the above group is, for example, duralumin that is an aluminum alloy including Al, Cu and Mg.

It is preferable that the thermal conducting portions 10 are substantially composed of a single component.

This configuration further improves the thermal conductivity of the thermal conducting portions 10. This configuration is also generally advantageous in reducing the manufacturing cost of the thermal conductor 1.

The expression of "being substantially composed of a single component" means that the proportion of a main component in a target location is not lower than 95% by weight. The proportion of the main component is preferably not lower than 97% by weight and is more preferably not lower than 99% by weight.

When a gas such as the air is included in the thermal conducting portions the content of the gas is disregarded. In the case where the thermal conducting portions 10 are made of a metal material, there is no substantial problem even when an oxide film, such as a passive film, of the metal constituting the thermal conducting portions 10 is formed on the surface of the thermal conducting portions 10. Such a case that an oxide film is formed is also regarded that the thermal conducting portions 10 "are substantially composed of a single component". The same applies to the thermal conducting portion-forming member 10' described later in detail.

The proportion of the thermal conducting portions 10 occupied in the thermal conductor 1 (the proportion in the natural state; the same applies hereinafter) is preferably not lower than 15% by volume and not higher than 80% by volume, is more preferably not lower than 20% by volume and not higher than 75% by volume, is furthermore preferably not lower than 25% by volume and not higher than 70% by volume, and is most preferably not lower than 30% by volume and not higher than 65% by volume.

This configuration ensures the sufficiently high proportion of the thermal conducting portions 10 occupied in the thermal conductor 1 and the higher flexibility of the thermal conductor 1 as a whole and thus more definitely makes the advantageous effects of the present disclosure described above more prominent.

1-2. Joint Portions

The joint portions 20 are placed between the plurality of thermal conducting portions 10 that are arranged in the island-like pattern in the planar view of the thermal conductor 1 in the first direction, so as to join the thermal conducting portions 10 with each other, and are configured to include a resin material 21 having flexibility. The resin material 21 is a cured form of a hardening resin material 21' described later.

The joint portions 20 including the resin material 21 having the flexibility provides the thermal conductor 1 with good shape compatibility to the surface shape of the member which the thermal conductor 1 is applied to, for example, a member to be cooled down.

Furthermore, the joint portions 20 including the resin material 21 having the flexibility effectively prevents the thermal conductor 1 from being broken when the thermal conductor 1 is deformed.

1-2-1. Resin Material

The resin material 21 constituting the joint portions 20 is required to have flexibility but is otherwise not specifically limited. Available examples of the resin material 21 include flexible epoxy resins, rubber resins, urethane resins, silicone resins, fluororesins, acrylic resins and thermoplastic elastomers. As shown in FIG. 6A, the resin material 21 includes a polyrotaxane 50 including cyclic molecules 51, a first polymer 52 having a linear molecular structure and including the cyclic molecules 51 in a skewered manner, and blocking groups 53 provided in the vicinity of respective ends of the first polymer 52; and a second polymer 60. It is preferable that the polyrotaxane 50 and the second polymer 60 are combined with each other via the cyclic molecules 51.

This configuration enhances the joint strength or the like between the thermal conducting portions 10 and the joint portions 20 in the thermal conductor 1. Even when the thermal conductor 1 is pressed repeatedly by a relatively large force or is pressed by a relatively large force for a long time period, this configuration also effectively suppresses irreversible deformation of the thermal conductor 1 and improves the durability of the thermal conductor 1. Furthermore, this configuration provides the thermal conductor 1 with extremely good flexibility and heat resistance.

Especially, when a stress is applied in directions of arrows to the resin material 21 in the state of FIG. 6A, the resin material 21 has the configuration shown in FIG. 6B. More specifically, in the resin material 21, the cyclic molecules 51 are movable along the first polymer 52. In other words, the first polymer 52 is movable in the cyclic molecules 51. This configuration enables a stress of deformation to be efficiently absorbed in the resin material 21. Even under application of a large external force, such as a twisting deformation force, this configuration effectively prevents the joint portions 20 from being broken and prevents the joints between the thermal conducting portions 10 from being destroyed.

The following describes the resin material 21 including the polyrotaxane 50 and the second polymer 60 in detail.

The cyclic molecule 51 as the constituent of the polyrotaxane 50 is required to be a cyclic molecule movable along the first polymer 52. The cyclic molecule 51 is preferably a cyclodextrin molecule that may be substituted. It is especially preferable that the cyclodextrin molecule is selected from the group consisting of α-cyclodextrin, β-cyclodextrin, γ-cyclodextrin and derivatives thereof.

At least part of the cyclic molecules 51 in the polyrotaxane 50 are combined with at least part of the second polymer 60 as described above.

Examples of a functional group of the cyclic molecule 51 (a functional group to be combined with the second polymer 60) include —OH group, —NH$_2$ group, —COOH group, epoxy group, vinyl group, thiol group, and photo-crosslinking group. Examples of the photo-crosslinking group include a cinnamic acid, coumarin, chalcone, anthracene, styryl pyridine, styryl pyridinium salts and styryl quinolinium salts.

On the assumption that the maximum possible amount of inclusion of the cyclic molecule 51 in the skewered manner by the first polymer 52 is equal to 1, the amount of inclusion of the cyclic molecule 51 in the skewered manner by the first polymer 52 is preferably not less than 0.001 and not greater than 0.6, is more preferably not less than 0.01 and not greater than 0.5, and is furthermore preferably not less than 0.05 and not greater than 0.4. Two or more different types of cyclic molecules 51 may be used.

Examples of the first polymer 52 as the constituent of the polyrotaxane 50 include polyvinyl alcohol, polyvinyl pyrrolidone, poly(meth)acrylic acid, cellulose resins such as carboxymethyl cellulose, hydroxy ethyl cellulose, and hydroxy propyl cellulose, polyacrylamide, polyethylene oxide, polyethylene glycol, polypropylene glycol, polyvinyl acetal resins, polyvinyl methyl ether, polyamines, polyethylene imine, casein, gelatin, starch and/or copolymers thereof, polyolefin resins such as polyethylene, polypropylene, and copolymer resins with other olefin monomers, polyester resins, polyvinyl chloride resins, polystyrene resins such as polystyrene and acrylonitrile-styrene copolymer resins, acrylic resins such as polymethyl methacrylate, (meth)acrylic ester copolymers, and acrylonitrile-methyl acrylate copolymer resins, polycarbonate resins, polyurethane resins, vinyl chloride-vinyl acetate copolymer resins, polyvinyl butyral resins, and derivatives and modified bodies thereof, polyisobutylene, polytetrahydrofuran, polyaniline, acrylonitrile-butadiene-styrene copolymers, polyamides such as nylons, polyimides, polydienes such as polyisoprene and polybutadiene, polysiloxanes such as polydimethylsiloxane, polysulfones, polyimines, poly (acetic anhydride), polyurea, polysulfides, polyphosphazenes, polyketones, polyphenylenes, polyhaloolefins, and derivatives thereof. Especially preferable is polyethylene glycol.

The weight average molecular weight of the first polymer 52 is preferably not less than ten thousand, is more preferably not less than twenty thousand, and is furthermore preferably not less than thirty five thousand. Two or more different types of the first polymers 52 may be used.

A preferable combination of the cyclic molecule 51 and the first polymer 52 is that the cyclic molecule 51 is α-cyclodextrin that may be substituted and the first polymer 52 is polyethylene glycol.

The blocking group 53 as the constituent of the polyrotaxane 50 is not specifically limited as long as the group has a function of preventing the cyclic molecule 51 from being released from the first polymer 52. Examples of the blocking group 53 include dinitrophenyl groups, cyclodextrins, adamantane groups, trityl groups, fluoresceins, pyrenes, substituted benzenes (examples of the substituent include alkyl, alkyloxy, hydroxy, halogen, cyano, sulfonyl, carboxyl, amino, and phenyl: there may be one substituent group or multiple substituent groups), polynuclear aromatics that may be substituted, and steroids.

Examples of the substituent group of the substituted benzenes or the substituted polynuclear aromatics include alkyl, alkyloxy, hydroxy, halogen, cyano, sulfonyl, carboxyl, amino and phenyl. There may be one substituent group or multiple substituent groups. Two or more different types of the blocking group 53 may be used.

In the resin material 21, at least part of the polyrotaxane 50 is combined with the second polymer 60 via the cyclic molecules 51. The resin material 21 may include the polyrotaxane 50 that is not combined with the second polymer 60 and may include the polyrotaxanes 50 that are combined with each other.

The second polymer 60 is combined with the polyrotaxane 50 via the cyclic molecules 51. Examples of the functional group of the second polymer 60 combined with the cyclic molecules 51 include —OH group, —NH$_2$ group, —COOH group, epoxy group, vinyl group, thiol group, and photo-crosslinking group. Examples of the photo-crosslinking group include a cinnamic acid, coumarin, chalcone, anthracene, styryl pyridine, styryl pyridinium salts and styryl quinolinium salts.

Examples of the second polymer 60 are those having a framework of any of the following various resins and having x the functional group described above: polyvinyl alcohol, polyvinyl pyrrolidone, poly(meth)acrylic acid, cellulose resins such as carboxymethyl cellulose, hydroxy ethyl cellulose, and hydroxy propyl cellulose, polyacrylamide, polyethylene oxide, polyethylene glycol, polypropylene glycol, polyvinyl acetal resins, polyvinyl methyl ether, polyamines, polyethylene imine, casein, gelatin, starch and/or copolymers thereof, polyolefin resins such as polyethylene, polypropylene, and copolymer resins with other olefin monomers, polyester resins, polyvinyl chloride resins, polystyrene resins such as polystyrene and acrylonitrile-styrene copolymer resins, acrylic resins such as polymethyl methacrylate, (meth)acrylic ester copolymers, and acrylonitrile-methyl acrylate copolymer resins, polycarbonate resins, polyurethane resins, vinyl chloride-vinyl acetate copolymer resins, polyvinyl butyral resins, and derivatives and modified bodies thereof, polyisobutylene, polytetrahydrofuran, polyaniline, acrylonitrile-butadiene-styrene copolymers, polyamides such as nylons, polyimides, polydienes such as polyisoprene and polybutadiene, polysiloxanes such as polydimethylsiloxane, polysulfones, polyimines, poly(acetic anhydride), polyurea, polysulfides, polyphosphazenes, polyketones, polyphenylenes, and polyhaloolefins.

The second polymer 60 and the cyclic molecules 51 may be chemically combined with each other by a cross-linking agent.

The molecular weight of the cross-linking agent is preferably smaller than 2000, is more preferably smaller than 1000, is furthermore preferably smaller than 600, and is most preferably smaller than 400.

Available examples of the cross-linking agent include cyanuric chloride, trimesoyl chloride, terephthaloyl chloride, epichlorohydrin, dibromobenzene, glutaraldehyde, phenylene diisocyanate, tolylene diisocyanate, divinyl sulfone, 1,1'-carbonyldiimidazole, and alkoxy silanes. Two or more different types of cross-linking agents may be used.

The second polymer 60 may be a homopolymer or a copolymer. In the resin material 21, at least part of the second polymer 60 is combined with the polyrotaxane 50 via the cyclic molecules 51. The resin material 21 may include the second polymer 60 that is not combined with the polyrotaxane 50 and may include the second polymers 60 that are combined with each other. Two or more different types of the second polymer 60 may be used.

The ratio of the content of the polyrotaxane 50 to the content of the second polymer 60 in the resin material 21 is preferably not lower than 1/1000 in the weight ratio.

1-2-2. Other Components

The joint portions 20 may contain components other than the resin material.

Examples of such components include metal particles, ceramic particles, spacers, fibrous base materials such as nonwoven fabrics and woven fabrics, plasticizers, coloring agents, antioxidants, ultraviolet absorbers, light stabilizers, softeners, modifiers, rust inhibitors, filling agents, electromagnetic wave absorption materials such as ferrite, surface lubricants, corrosion inhibitors, heat-resistant stabilizers, lubricants, primers, antistatic agents, polymerization inhibitors, cross-linking agents, catalysts, leveling agents, thickening agent, dispersing agents, anti-aging agents, flame retardants, hydrolysis inhibitors, and corrosion preventive agents.

Inclusion of the metal particles in the joint portions 20 has the following advantageous effects.

As described above, the part of the thermal conductor 1 mainly contributing to the thermal conductivity is the thermal conducting portions 10. The metal particles generally have the higher thermal conductivity than that of the resin material 21 constituting the joint portions 20. Inclusion of the metal particles in the joint portions 20 enhances the thermal conductivity of the joint portions 20 and thereby further improves the overall thermal conductivity of the thermal conductor 1.

Especially, in the case where the adjacent thermal conducting portions 10 are connected with each other by one or multiple metal particles included in the joint portions 20, the metal particles serve as the "thermal path" to thermally connect the thermal conducting portions 10 with each other, and further improves the overall thermal conductivity of the thermal conductor 1.

Furthermore, inclusion of metal particles made of a metal material having electromagnetic shielding property provides the thermal conductor 1 with the electromagnetic shielding function. Especially this provides the thermal conductor 1 with the shielding function against high-frequency electromagnetic wave used in, for example, the fifth-generation mobile communication.

The metal particles preferably include one metal or two or more metals selected from the group consisting of Fe, Ag, Pt, Cu, Sn, Al and Ni and more preferably include Fe.

The shape of the metal particles is not specifically limited but is preferably a spherical shape and is more preferably a perfect spherical shape.

This configuration makes the advantageous effects described above more prominent.

More specifically, a shape factor SF-2 of the metal particles is preferably not lower than 100 and not higher than 150, is more preferably not lower than 100 and not higher than 125, and is furthermore preferably not lower than 100 and not higher than 120.

The shape factor SF-2 is a numerical value obtained by dividing a square value of a projected perimeter of each particle by a projected area of the particle, further dividing a result of the division by 4π, and multiplying a result of the division by 100. The shape factor SF-2 is closer to 100 according to the particle having the shape closer to a sphere.

The shape factor SF-2 may be determined, for example, by a procedure of measurement described below.

The procedure determines a projected area S [μm$^2$] and a projected perimeter L [μm] with regard to each of a hundred metal particles by observation using FE-SEM and calculates a value of the shape factor SF-2 according to Expression given below. The procedure then employs an average value of the values of the shape factor SF-2 with regard to the respective metal particles, as the shape factor SF-2 of the metal particles:

$$SF\text{-}2 = ((L^2/S)/4\pi) \times 100$$

The average particle diameter of the metal particles is not specifically limited but is preferably not less than 0.01 μm and not greater than 10 µm and is more preferably not less than 0.1 µm and not greater than 3.0 µm.

This configuration makes the advantageous effects described above furthermore prominent.

The average particle diameter in the specification hereof means a particle diameter at an accumulation of 50% from the smaller diameter-side in a weight-based particle size distribution measured by a laser diffraction-type particle size distribution measurement device.

Iron particles are preferable as the metal particles.

The iron particles used are, for example, iron particles produced by pyrolysis of $Fe(CO)_5$.

Such iron particles have a very high purity, a perfect spherical shape as described above, and a fine average particle diameter. Accordingly this configuration makes the advantageous effects described above especially prominent.

In the case where the metal particles are included in the joint portions 20, the content rate of the metal particles in the joint portions 20 (the content rate in the natural state) is preferably not lower than 1% by volume and not higher than 50% by volume and is more preferably not lower than 10% by volume and not higher than 30% by volume.

This configuration has the advantageous effects by inclusion of the resin material 21 and the advantageous effects by inclusion of the metal particles as described above in a balanced manner.

Inclusion of the ceramic particles in the joint portions 20 stabilizes and uniformizes the structure of the joint portions 20 and also stabilizes the proportion and the size of the voids in the joint portions 20. As a result, this configuration more effectively prevents an unintentional variation in the properties at the respective locations of the thermal conductor 1.

Various ceramics may be used as the constituent material of the ceramic particles. Using the ceramic material, for example, a nitride ceramic such as aluminum nitride, boron nitride or silicon nitride, a carbide ceramic such as silicon carbide, or an oxide ceramic such as alumina further improves the overall thermal conductivity of the thermal conductor 1. Especially, in the case where the adjacent thermal conducting portions 10 are connected with each other by one or multiple ceramic particles included in the joint portions 20, the ceramic particles serve as the "thermal path" to thermally connect the thermal conducting portions 10 with each other, and further improves the overall thermal conductivity of the thermal conductor 1.

When the joint portions 20 include the metal particles described above, in addition to the ceramic particles, the thermal path may be formed by the ceramic particles and the metal particles.

The ceramic particles may be made of silica. This configuration ensures the advantageous effects of stabilizing and uniformizing the structure of the joint portions 20 described above, while reducing the manufacturing cost of the thermal conductor 1.

The shape of the ceramic particles is not specifically limited but is preferably a spherical shape and is more preferably a perfect spherical shape.

This configuration makes the advantageous effects described above more prominent.

The average particle diameter of the ceramic particles is not specifically limited but is preferably not less than 5 µm and not greater than 200 µm, is more preferably not less than 10 µm and not greater than 100 µm, and is furthermore preferably not less than 20 µm and not greater than 70 µm.

This configuration makes the advantageous effects described above more prominent.

The content rate of the ceramic particles in the joint portions 20 (the content rate in the natural state) is preferably not lower than 1% by volume and not higher than 50% by volume and is more preferably not lower than 10% by volume and not higher than 30% by volume.

This configuration has the advantageous effects by inclusion of the resin material 21 and the advantageous effects by inclusion of the ceramic particles as described above in a balanced manner.

The content rate of the components other than the resin material, the metal particles and the ceramic particles in the joint portions 20 is preferably not higher than 5% by weight, is more preferably not higher than 3% by weight, and is furthermore preferably not higher than 1% by weight.

Inclusion of the spacer in the joint portions 20 effectively reduces an unintentional variation in the thickness of the joint portions 20. This also enables the voids 2 to be appropriately formed between the resin material 21 as the constituent of the joint portions 20 and the spacer. Especially using the spacer having the size and the shape as described below significantly enhances such advantageous effects. This configuration also effectively prevents the resin material 21 as the constituent of the joint portions 20 from being protruded from an end of the thermal conductor 1 in the process of manufacturing the thermal conductor 1. As a result, this configuration effectively prevents the occurrence of a problem that the joint portions 20 preferentially come into contact with the member which the thermal conductor 1 is applied to and thereby interfere with the contact with the thermal conducting portions 10. This configuration more definitely improves the actual thermal conductivity.

The shape of the spacer may be, for example, a spheroidal shape, a cylindrical shape, a rectangular prismatic shape, or a needle-like shape but is preferably a spherical shape and is more preferably a perfect spherical shape.

This configuration more effectively reduces an unintentional variation in the thickness of the joint portions 20. This configuration also enables the voids 2 to be more appropriately formed between the resin material 21 as the constituent of the joint portions 20 and the spacer.

When the spacer has a spherical shape or especially has a perfect spherical shape, the shape factor SF-2 of the spacer is preferably not lower than 100 and not higher than 150, is more preferably not lower than 100 and not higher than 125, and is furthermore preferably not lower than 100 and not higher than 120.

This configuration makes the advantageous effects described above more prominent.

When the spacer has a spherical shape or especially has a perfect spherical shape, the average particle diameter of the spacer is not specifically limited but is preferably not less than 0.1 µm and not greater than 100 µm and is more preferably not less than 1 µm and not greater than 50 µm.

This configuration makes the advantageous effects described above more prominent.

The spacer may be made of any material and may be made of, for example, a metal material, a ceramic material or glass. The spacer made of a resin material is, however, preferable.

This configuration further enhances the adhesiveness between the spacer and the resin material 21 and thereby further improves the durability and the reliability of the thermal conductor 1.

Examples of the resin material as the constituent of the spacer include polyester resins such as polyethylene terephthalate, acrylic resins, polyvinyl chloride, polystyrene, polyolefin resins such as polyethylene and polypropylene, phenolic resins (including Bakelite), and fluororesins. The resin material used may be one resin selected among these resins or may be two or more resins in combination. Among them, the acrylic resins, the phenolic resins (including Bakelite) and the fluororesins have good heat resistance. The acrylic resins also have remarkably good softness in processing.

When the joint portions 20 include the spacer, the content rate of the spacer in the joint portions 20 is preferably not lower than 0.1% by volume and not higher than 20% by volume, and is more preferably not lower than 0.5% by volume and not higher than 10% by volume.

Inclusion of the fibrous base material in the joint portions 20 effectively reduces an unintentional variation in the thickness of the joint portions 20. This also enables the voids 2 to be appropriately formed between the resin material 21 as the constituent of the joint portions 20 and the fibrous base material. This configuration also effectively prevents the resin material 21 as the constituent of the joint portions 20 from being protruded from an end of the thermal conductor 1 in the process of manufacturing the thermal conductor 1. As a result, this configuration effectively prevents the occurrence of a problem that the joint portions 20 preferentially come into contact with the member which the thermal conductor 1 is applied to and thereby interfere with the contact with the thermal conducting portions 10. This configuration more definitely improves the actual thermal conductivity.

As described above, the fibrous base material is, for example, non-woven fabric or woven fabric but is preferably non-woven fabric.

The constituent material of the fibers constituting the fibrous base material is, for example, glass, cellulose, polyolefin such as polyethylene or polypropylene, polyester such as polyethylene terephthalate, polyamide, ethylene vinyl acetate resin, polyvinyl alcohol, or synthetic rubber. The constituent material of the fibers used may be one material selected among these materials or may be two or more materials in combination. The constituent material of the fibers used is preferably polyester or more preferably polyethylene terephthalate.

This configuration further enhances the intensity of the fibrous base material and further enhances the adhesiveness between the fibrous base material and the resin material 21, thus further improving the durability and the reliability of the thermal conductor 1.

When the joint portions 20 include the fibrous base material, the thickness of the fibrous base material is preferably not less than 3 μm and not greater than 300 μm and is more preferably not less than 5 μm and not greater than 100 μm.

A thickness of the joint portions 20 shown by $t_2$ in FIG. 1 is preferably not less than 1 μm and not greater than 2000 μm, is more preferably not less than 2 μm and not greater than 1500 μm, and is furthermore preferably not less than 3 μm and not greater than 1000 μm.

This configuration makes the advantageous effects of the present disclosure described above more prominent.

The proportion of the joint portions 20 occupied in the thermal conductor 1 (the proportion in the natural state; the same applies hereinafter) is preferably not lower than 15% by volume and not higher than 70% by volume, is more preferably not lower than 20% by volume and not higher than 65% by volume, is furthermore preferably not lower than 25% by volume and not higher than 60% by volume, and is most preferably not lower than 30% by volume and not higher than 60% by volume.

This configuration ensures the sufficiently high proportion of the thermal conducting portions 10 occupied in the thermal conductor 1 and the higher flexibility of the thermal conductor 1 as a whole and thus more definitely makes the advantageous effects of the present disclosure described above more prominent.

1-3. Voids

The voids 2 are parts where neither the thermal conducting portion 10 nor the joint portion 20 is present in the thermal conductor 1. The air and gases, for example, a gas generated in the process of curing the resin material 21 that constitutes the joint portions 20 are generally included in the voids 2.

The presence of the voids 2 in the thermal conductor 1 enables the voids 2 to serve as the cushion when the thermal conductor 1 is pressed and to absorb deformation of the thermal conductor 1 being pressed or more specifically deformation of the joint portions 20, so as to suppress excessive deformation. This configuration provides the thermal conductor 1 with appropriate flexibility and suitably regulates the amount of extrusion of the thermal conductor 1 to satisfy the condition described above.

In the thermal conductor 1, the voids 2 are provided at least in locations adjacent to the joint portions 20.

The proportion of the voids 2 occupied in the thermal conductor 1 (the proportion in the natural state; the same applies hereinafter) is preferably not lower than 5% by volume and not higher than 65% by volume, is more preferably not lower than 5% by volume and not higher than 50% by volume, is furthermore preferably not lower than 6% by volume and not higher than 40% by volume, and is most preferably not lower than 7% by volume and not higher than 32% by volume.

This configuration makes the advantageous effects of the present disclosure described above more prominent.

When the proportion of the thermal conducting portions 10 occupied in the thermal conductor 1 is expressed by VC [% by volume], the proportion of the joint portions 20 occupied in the thermal conductor 1 is expressed by VJ [% by volume] and the proportion of the voids 2 occupied in the thermal conductor 1 is expressed by VV [% by volume], the thermal conductor 1 preferably satisfies a relationship of $25 \leq [(VJ+VV)/(VC+VJ+VV)] \times 100 \leq 90$, more preferably satisfies a relationship of $25 \leq [(VJ+VV)/(VC+VJ+VV)] \times 100 \leq 85$, furthermore preferably satisfies a relationship of $31 \leq [(VJ+VV)/(VC+VJ+VV)] \times 100 \leq 80$, and most preferably satisfies a relationship of $37 \leq [(VJ+VV)/(VC+VJ+VV)] \times 100 \leq 75$.

This configuration makes the advantageous effects of the present disclosure described above more prominent.

The density of the thermal conductor 1 in the state before being pressed (in the natural state) is preferably not lower than 0.6 g/cm$^3$ and not higher than 2.5 g/cm$^3$, and is more preferably not lower than 0.9 g/cm$^3$ and not higher than 2.0 g/cm$^3$.

The density of aluminum commonly used in a conventional thermal conductor, for example, a heat release member such as heat sink is about 2.7 g/cm$^3$.

Using the materials described above as the constituent materials of the thermal conducting portions 10 and the joint portions 20 in the thermal conductor 1 reduces the overall density to be lower than the density of the conventional thermal conductor.

This configuration especially reduces the weight of the thermal conductor 1 and does not obstruct weight reduction of an electronic device or the like in the case where the thermal conductor 1 is mounted on the electronic device or the like. In other words, this configuration makes the electronic device or the like lighter.

When the area of the thermal conductor 1 in the planar view in the second direction that is perpendicular to the first direction is expressed by S3 [cm$^2$] and the area of the thermal conductor 1 observed in the second direction in the pressed state that the thermal conductor 1 is pressed by 0.2 MPa in the first direction is expressed by S4 [cm$^2$] as shown in FIG. 3A, FIG. 3B, FIG. 4A and FIG. 4B, the thermal conductor 1 preferably satisfies a condition of $5 \leq [(S3-S4)/S3] \times 100 \leq 50$, more preferably satisfies a condition of $7 \leq [(S3-S4)/S3] \times 100 \leq 40$, and furthermore preferably satisfies a condition of $10 \leq [(S3-S4)/S3] \times 100 \leq 25$.

As shown in FIG. 3A, FIG. 3B, FIG. 4A, and FIG. 4B, in the planar view of the thermal conductor 1 in the second direction, the area S4 of the thermal conductor 1 in the pressed state is smaller than the area S3 of the thermal conductor 1 in the natural state.

The areas S3 and S4 satisfying the above condition makes the advantageous effects of the present disclosure described above more prominent.

Each of the values of S3 and S4 employed may be an average value of areas observed in multiple different directions perpendicular to the first direction, for example, an average value of areas observed in two different directions that are perpendicular to the first direction and that are also perpendicular to each other, such as an average value of an area observed in an x direction and an area observed in a y direction. Such values are employed as the values of S3 and S4 in Examples described later.

When the length of the thermal conductor 1 in the first direction in an initial state, i.e., in the natural state is expressed by L0 [mm] and the length of the thermal conductor 1 in the first direction when an operation of pressing the thermal conductor 1 in the first direction by 1.0 MPa for one minute and releasing the thermal conductor 1 from the pressed state to leave the thermal conductor 1 in the released state for one minute is repeated 1000 number of times is expressed by L1 [mm], the thermal conductor 1 preferably satisfies a relationship of $0.70 \leq L1/L0$, more preferably satisfies a relationship of $0.75 \leq L1/L0$, and furthermore preferably satisfies a relationship of $0.80 \leq L1/L0 \leq 1.00$.

The thermal conductor 1 of this configuration is sufficiently restorable even in the repetition of the pressed state and the released state and has especially high durability. The thermal conductor 1 is also suitably reusable.

When the thermal conducting portions 10 are made of a graphite sheet, the thermal conductor 1 preferably satisfies a relationship of $0.80 \leq L1/L0$, more preferably satisfies a relationship of $0.83 \leq L1/L0$, and furthermore preferably satisfies a relationship of $0.85 \leq L1/L0 \leq 1.00$.

This configuration makes the advantageous effects described above more prominent.

When the thermal conducting portions 10 are made of aluminum, the thermal conductor 1 preferably satisfies a relationship of $0.70 \leq L1/L0$, more preferably satisfies a relationship of $0.73 \leq L1/L0$, and furthermore preferably satisfies a relationship of $0.75 \leq L1/L0 \leq 1.00$.

This configuration makes the advantageous effects described above more prominent.

The observed value of the thermal conductivity of the thermal conductor 1 in the first direction in the pressed state that the thermal conductor 1 is pressed by 0.2 MPa in the first direction is preferably not lower than 50 W/(m·K), is more preferably not lower than 70 W/(m·K) and not higher than 1200 W/(m·K), and is furthermore preferably not lower than 100 W/(m·K) and not higher than 800 W/(m·K).

This configuration improves the adhesiveness between the thermal conductor 1 and the member which the thermal conductor 1 is applied to in the pressed state, reduces an interfacial thermal resistance and achieves an extremely high actual thermal conductivity.

The observed value of the thermal conductivity may be measured by, for example, a method in conformity with the US Standard ASTM D5470.

The observed value of the thermal conductivity may be determined by measurement using, for example, a thermal diffusivity and thermal conductivity measurement devices (ai-Phase Mobile M3 series manufactured by ai-Phase Co., Ltd.) The temperature of measurement may be 50° C.

According to the embodiment, the observed value of the thermal conductivity is a value measured by using a sample of the thermal conductor 1 having a pressing surface in a shape adjusted to a square of 40 mm×40 mm.

2. Manufacturing Method of Thermal Conductor

The following describes a manufacturing method of the thermal conductor according to the present disclosure.

Figure 7:
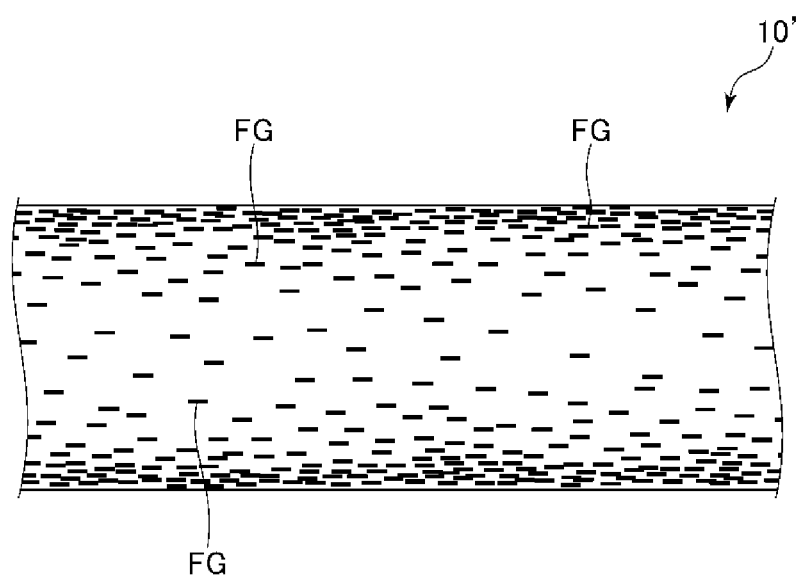
FIG. 7 is a sectional view schematically illustrating a thermal conducting portion-forming member made of scale-like graphite.
Figure 8:
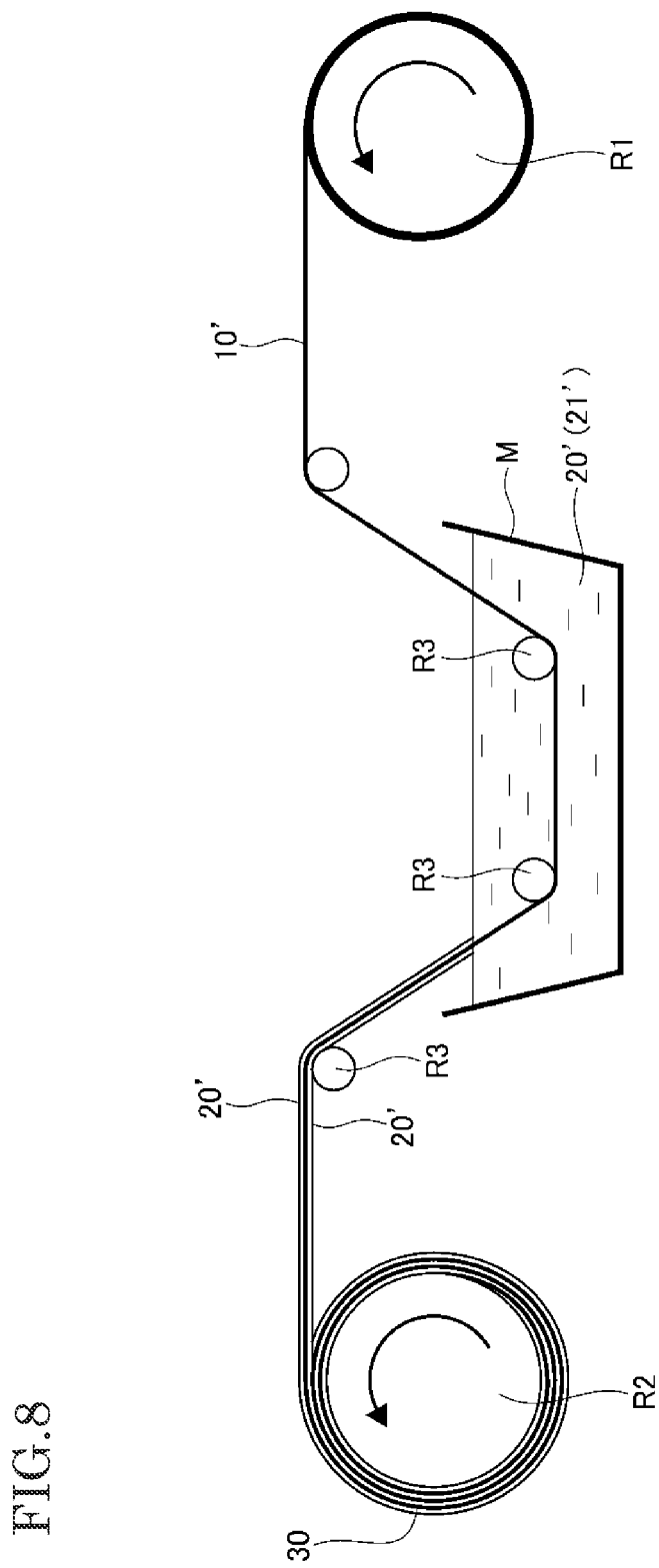
FIG. 8 is a diagram schematically illustrating one example of an apparatus used in a joint portion-forming composition adhesion process and a winding process.
Figure 9A:
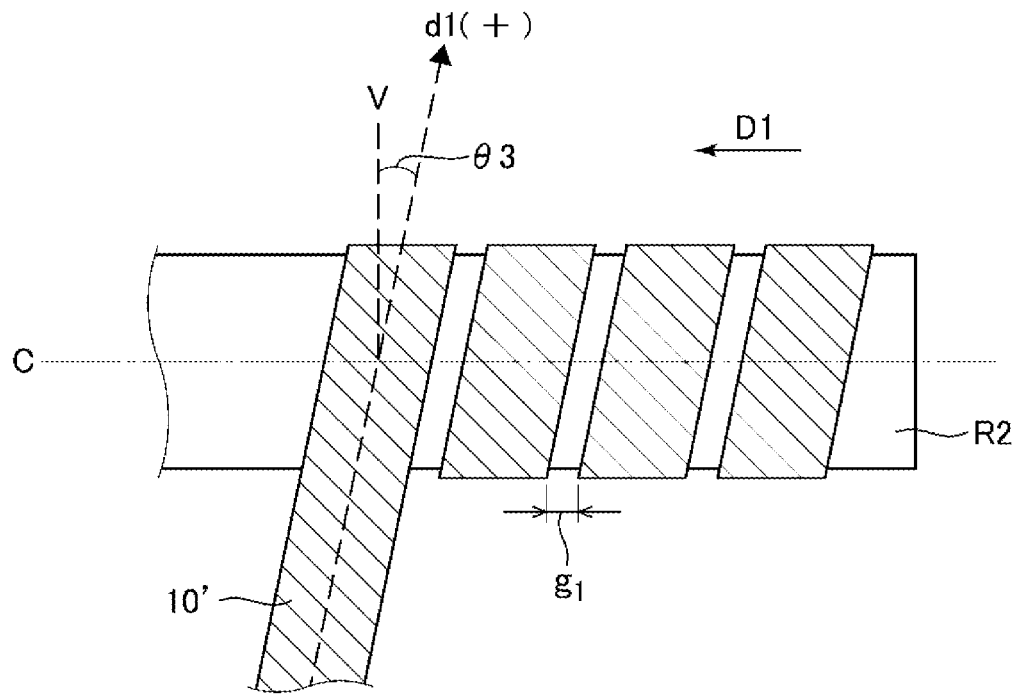
FIG. 9A is a diagram illustrating winding of the thermal conducting portion-forming member on the surface of a roll by traverse winding in the winding process.
Figure 9B:
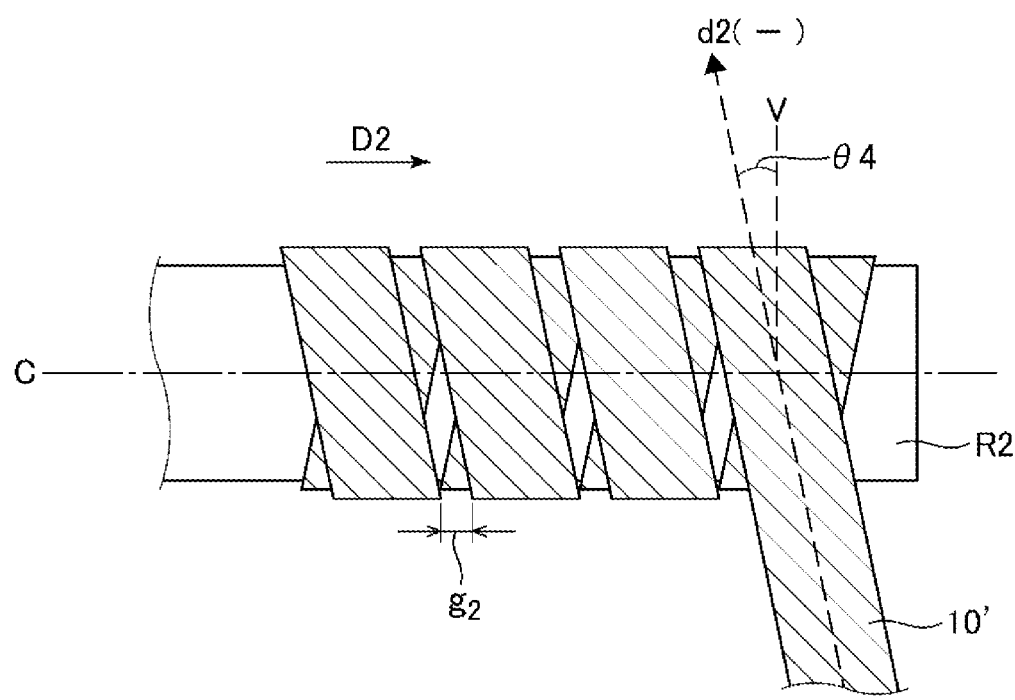
FIG. 9B is a diagram illustrating winding of the thermal conducting portion-forming member on the surface of a roll by traverse winding in the winding process.
Figure 10:
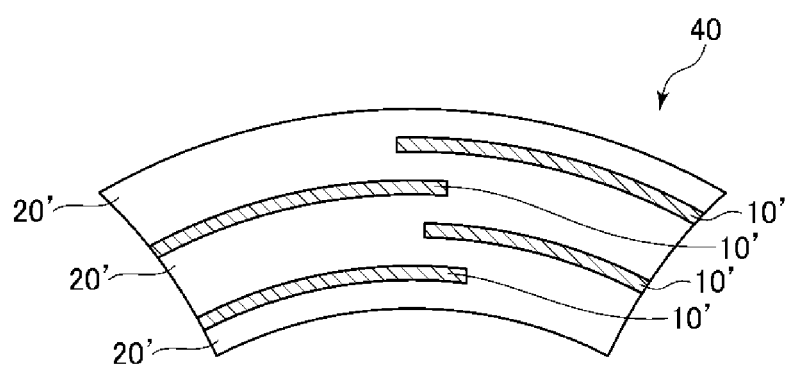
FIG. 10 is a diagram schematically illustrating a cut body obtained in a cutting process.
Figure 11:
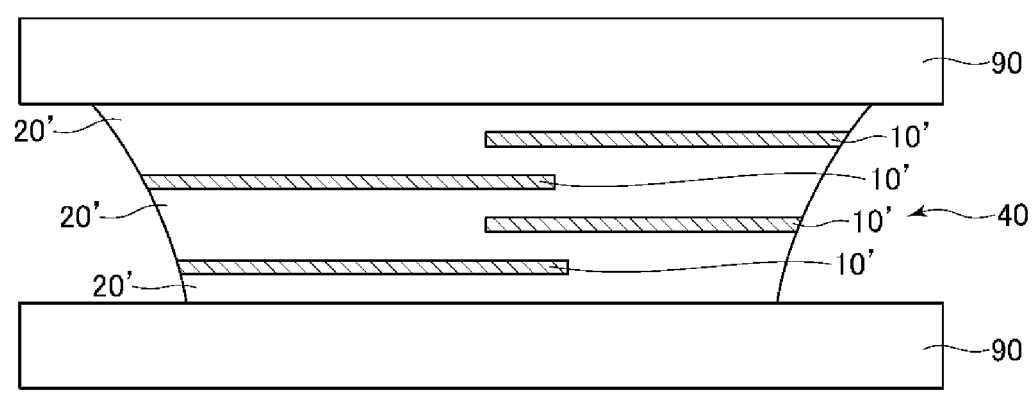
FIG. 11 is a diagram schematically illustrating the state that the cut body is pressed to have the higher flatness.
Figure 12:
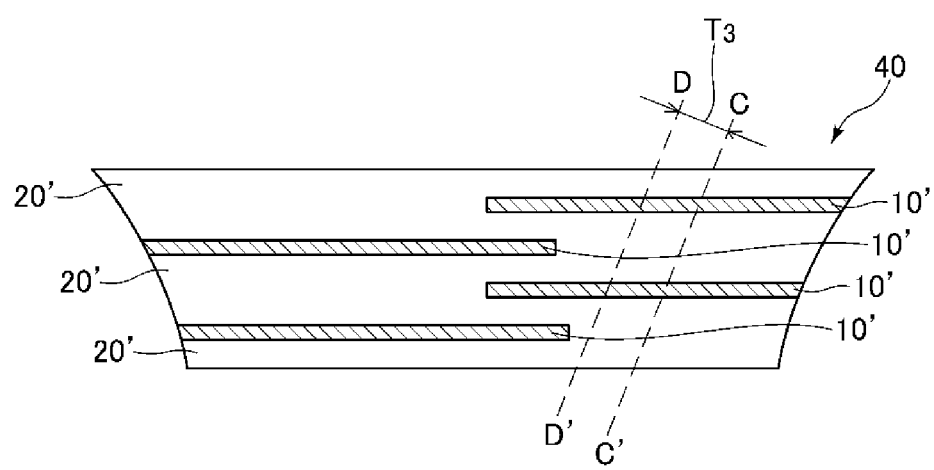
FIG. 12 is a diagram schematically illustrating a slicing process.

FIG. 7 is a sectional view schematically illustrating a thermal conducting portion-forming member made of scale-like graphite. FIG. 8 is a diagram schematically illustrating one example of an apparatus used in a joint portion-forming composition adhesion process and a winding process. FIG. 9A and FIG. 9B are diagrams illustrating winding of the thermal conducting portion-forming member on the surface of a roll by traverse winding in the winding process; FIG. 9A is a diagram illustrating the state of a first winding layer (first layer) of the thermal conducting portion-forming member 10' on a wind-up roll R2, and FIG. 9B is a diagram illustrating the state of a second winding layer (second layer) of the thermal conducting portion-forming member 10'. FIG. 10 is a diagram schematically illustrating a cut body obtained in a cutting process. FIG. 11 is a diagram schematically illustrating the state that the cut body is pressed to have the higher flatness. FIG. 12 is a diagram schematically illustrating a slicing process. Each of FIG. 9A and FIG. 9B only illustrates only the thermal conducting portion-forming member 10' with omission of the joint portion-forming composition 20'.

The manufacturing method of the thermal conductor according to the present disclosure is a method of manufacturing the thermal conductor 1 including the plurality of thermal conducting portions 10 and the joint portions 20 configured to join the respective thermal conducting portions 10 with each other. The manufacturing method of the thermal conductor includes a thermal conducting portion-forming member providing process of providing a thermal conducting portion-forming member 10' that is used to form the thermal conducting portions 10; and a joint portion-forming composition adhesion process of making a joint portion-forming composition 20' that is used to form the joint portions 20, adhere to the surface of the thermal conducting portion-forming member 10'. The thermal conductor 1 has the voids 2 where neither the thermal conducting portion 10 nor the joint portion 20 is present. When the area of the thermal conductor 1 in the planar view in the first direction is expressed by S0 [cm$^2$] and the area of the thermal conductor 1 in the planar view in the first direction in the pressed state that the thermal conductor 1 is pressed by 0.2 MPa in the first direction is expressed by S1 [cm$^2$], the thermal conductor 1 satisfies a condition of $0.5 \leq [(S1-S0)/S0] \times 100 \leq 20$.

This provides the manufacturing method of the thermal conductor 1 to efficiently manufacture the thermal conductor 1 that satisfies both ensuring the adhesiveness to a member in contact with the thermal conductor in use and suppressing an excessive deformation of the thermal conductor in a compressed state.

The manufacturing method of the thermal conductor according to the present disclosure is a method of manufacturing the thermal conductor 1 including the plurality of thermal conducting portions 10 and the joint portions configured to join the respective thermal conducting portions 10 with each other. The manufacturing method of the thermal conductor includes a thermal conducting portion-forming member providing process of providing a long thermal conducting portion-forming member 10' that is used to form the thermal conducting portions 10; a joint portion-forming composition adhesion process of making a joint portion-forming composition 20' that is used to form the joint portions 20, adhere to the surface of the thermal conducting portion-forming member 10'; a winding process of winding the thermal conducting portion-forming member 10' with the joint portion-forming composition 20' adhering thereto, on a peripheral surface of a roll (wind-up roll R2) by traverse winding to obtain a wound body 30 in a tubular shape; and a cutting process of cutting open the wound body 30 in a direction that is not perpendicular to an axial direction of the roll to obtain a cut body 40.

This provides the manufacturing method of the thermal conductor 1 to efficiently manufacture the thermal conductor 1 that satisfies both ensuring the adhesiveness to a member in contact with the thermal conductor in use and suppressing an excessive deformation of the thermal conductor in a compressed state. Especially, the configuration of winding the thermal conducting portion-forming member 10' with the joint portion-forming composition 20' adhering thereto, on the peripheral surface of the roll by traverse winding enables the thermal conductor 1 to be manufactured with the higher efficiency, compared with a configuration using sheets of sheet-like material.

The manufacturing method of the thermal conductor according to the present disclosure also includes a joint portion-forming composition providing process of providing the joint portion-forming composition 20' that is used to form the joint portions 20, prior to the joint portion-forming composition adhesion process.

2-1. Thermal Conducting Portion-Forming Member Providing Process

The thermal conducting portion-forming member providing process provides the thermal conducting portion-forming member 10' that is used to form the thermal conducting portions 10.

2-1-1. Thermal Conducting Portion-Forming Member

The thermal conducting portion-forming member 10' used in the joint portion-forming composition adhesion process is supposed to form the thermal conducting portions 10 in the thermal conductor 1.

The shape of the thermal conducting portion-forming member 10' provided in this process is not specifically limited but is a long shape according to the embodiment.

This configuration further enhances the productivity of the thermal conductor 1. This configuration also more effectively suppresses an unintentional variation in the properties at the respective locations of the thermal conductor 1 manufactured.

It is preferable that the thermal conducting portion-forming member 10' is substantially made of a single component.

This further enhances the thermal conductivity of the thermal conducting portions 10 formed. This is also generally advantageous in reducing the manufacturing cost of the thermal conductor 1.

A sheet member made of a material corresponding to the thermal conducting portions 10 to be formed or more specifically a long (tape-like) sheet member may be used as the thermal conducting portion-forming member 10'.

When the long (tape-like) sheet member is used as the thermal conducting portion-forming member 10', the thermal conducting portion-forming member 10' is preferably in a belt-like form having irregularities on a main surface thereof.

This enables the joint portion-forming composition 20' to appropriately adhere to the surface of the thermal conducting portion-forming member 10'. This also enables air bubbles to be appropriately included between the thermal conducting portion-forming member 10' and the joint portion-forming composition 20'. Furthermore, this effectively suppresses the joint portions 20 from being detached from the thermal conducting portions 10 after the resin material 21 is cured. Moreover, this enables the voids 2 to be appropriately formed.

More specifically, a surface roughness in maximum height Rz of the thermal conducting portion-forming member 10' is preferably not less than 0.1 μm and not greater than 50 μm, is more preferably not less than 0.5 μm and not greater than 30 μm, and is furthermore preferably not less than 5.0 μm and not greater than 20 μm.

This configuration makes the advantageous effects described above more prominent.

The surface roughness in maximum height Rz of the thermal conducting portion-forming member 10' may be measured by, for example, a method in conformity with JIS B 0601-2013.

When the long (tape-like) sheet member is used as the thermal conducting portion-forming member 10', the thickness of the thermal conducting portion-forming member 10' is preferably not less than 5 μm and not greater than 500 μm and is more preferably not less than 10 μm and not greater than 200 μm.

This configuration ensures the sufficiently high proportion of the thermal conducting portions 10 occupied in the thermal conductor 1 and provides the thermal conductor 1 with the higher overall flexibility. This configuration thus more definitely makes the advantageous effects of the present disclosure described above more prominent.

When the long (tape-like) sheet member is used as the thermal conducting portion-forming member 10', the width is preferably not less than 2 mm and not greater than 70 mm and is more preferably not less than 5 mm and is not greater than 50 mm.

This configuration ensures the sufficiently high proportion of the thermal conducting portions 10 occupied in the thermal conductor 1 and provides the thermal conductor 1 with the higher overall flexibility. This configuration thus more definitely makes the advantageous effects of the present disclosure described above more prominent. Furthermore, this configuration enhances the ease in handling of the thermal conducting portion-forming member 10' and advantageously improves the productivity of the thermal conductor 1.

In the case where the long (tape-like) sheet member is used as the thermal conducting portion-forming member 10', using a sheet member containing graphite (graphite sheet member) as the thermal conducting portion-forming member 10' reduces the manufacturing cost of the thermal conductor 1, while ensuring the high actual thermal conductivity between the thermal conductor 1 and the member which the thermal conductor 1 is applied to. Furthermore, this configuration improves the ductility and the flexibility of the thermal conductor 1 and more specifically enhances, for example, the restoring force when the thermal conductor 1 is bent, the cushioning properties by the internal voids, and the improved contact performance by appropriate deformation in contact with an overheat portion.

In the case where the long (tape-like) sheet member is used as the thermal conducting portion-forming member 10', for example, a sheet member made from carbon fibers by using papermaking technology (carbon fiber-papering sheet member) may be used as the thermal conducting portion-forming member 10'. This configuration reduces the manufacturing cost of the thermal conductor 1, while ensuring the high actual thermal conductivity between the thermal conductor 1 and the member which the thermal conductor 1 is applied to. Furthermore, this configuration improves the ductility and the flexibility of the thermal conductor 1 and more specifically enhances, for example, the restoring force when the thermal conductor 1 is bent, the cushioning properties by the internal voids, and the improved contact performance by appropriate deformation in contact with an overheat portion.

In the case where the long (tape-like) sheet member is used as the thermal conducting portion-forming member 10', for example, a sheet member made of a metal material (metal sheet member) may be used as the thermal conducting portion-forming member 10'. This configuration reduces the manufacturing cost of the thermal conductor 1, while ensuring the high actual thermal conductivity between the thermal conductor 1 and the member which the thermal conductor 1 is applied to. Furthermore, this configuration reduces dusting of the thermal conductor 1 because of the high binding force inside of the metal material. This configuration also more effectively suppresses irreversible deformation of the thermal conductor 1, for example, collapse of the thermal conductor 1 due to buckling or the like, even when a relatively large load is applied to the thermal conductor 1.

Fibers made of a thermal conductive material and extended in a longitudinal direction of the thermal conducting portion-forming member 10' may also be used as the thermal conducting portion-forming member 10'.

In the case where fibers are used as the thermal conducting portion-forming member 10', the thermal conducting portion-forming member 10' used may include a fiber bundle extended in the longitudinal direction of the thermal conducting portion-forming member 10'.

This configuration enables the joint portion-forming composition 20' to appropriately adhere to the clearances of the fiber bundle and enables an appropriate amount of the joint portion-forming composition 20' to adhere to the thermal conducting portion-forming member 10'. This also enables air bubbles to be appropriately included between the thermal conducting portion-forming member 10' and the joint portion-forming composition 20'. Furthermore, this effectively suppresses the joint portions 20 from being detached from the thermal conducting portions 10 after the resin material 21 is cured. Moreover, this enables the voids 2 to be appropriately formed.

The fiber bundle may be a primary fiber bundle formed by collecting and bundling several ten single fibers or may be a secondary fiber bundle formed as a larger bundle by collecting several ten primary fiber bundles.

In the case where the fibers are used as the thermal conducting portion-forming member 10', carbon fibers are preferably used. This configuration reduces the manufacturing cost of the thermal conductor 1, while ensuring the high actual thermal conductivity between the thermal conductor 1 and the member which the thermal conductor 1 is applied to. Furthermore, this configuration improves the ductility and the flexibility of the thermal conductor 1 and more specifically enhances, for example, the restoring force when the thermal conductor 1 is bent, the cushioning properties by the internal voids, and the improved contact performance by appropriate deformation in contact with an overheat portion.

In the case where the fibers are used as the thermal conducting portion-forming member 10', metal fibers may be used. This configuration reduces the manufacturing cost of the thermal conductor 1, while ensuring the high actual thermal conductivity between the thermal conductor 1 and the member which the thermal conductor 1 is applied to. Furthermore, this configuration reduces dusting of the thermal conductor 1 because of the high binding force inside of the metal material. This configuration also more effectively suppresses irreversible deformation of the thermal conductor 1, for example, collapse of the thermal conductor 1 due to buckling or the like, even when a relatively large load is applied to the thermal conductor 1.

2-1-1-1. Graphite Sheet Member

The graphite sheet member used may include components other than graphite, for example, a binder and a resin fiber, in addition to graphite. It is, however, preferable that the graphite sheet member is substantially composed of only graphite, i.e., is substantially composed of a single component.

The graphite is preferably scale-like graphite.

This configuration enables the scale-like graphite to be appropriately oriented in an extending direction of the thermal conducting portions 10 and improves the thermal conductivity especially in the extending direction of the thermal conducting portions 10.

More specifically, when scale-like graphite is compacted in a sheet-like form, scale-like graphite FG is oriented in an in-plane direction of the sheet as shown in FIG. 7. In other words, the scale-like graphite FG is appropriately oriented in such a manner that the thickness direction of the scale-like graphite FG is along the thickness direction of the sheet. In the thermal conductor 1, this configuration provides the remarkably high thermal conductivity in the extending direction of the thermal conducting portions 10.

It is preferable to manufacture the graphite sheet member by a method including, for example, a pressing process of forming the scale-like graphite under application of a pressure to a sheet-like form, a drying process of drying the graphite formed in the sheet-like form, and a pressing-heating process of applying heat and pressure to (hot-pressing) the graphite formed in the sheet-like form.

The pressing process forms the graphite under application of pressure to a sheet-like form. The pressing process is preferably performed, for example, at temperature of not lower than 10° C. and not higher than 35° C. The applied pressure is, for example, not lower than 1 MPa and not higher than 30 MPa. A composition used for forming may include water, a binder and the like, in addition to graphite. The composition including other components such as a binder in addition to graphite may be used in the pressing process. A heating process or the like is performed to remove or carbonize such components and thus effectively prevents the components from being left in the finally obtained graphite sheet member.

The drying process dries the graphite formed in the sheet-like form. This removes volatile components such as excess water and improves the handling property. This also improves the shape stability and the intensity of the graphite sheet member.

The drying process may be performed under reduced pressure, by heating or by natural drying. When the drying process is performed by heating, the heating temperature may be not lower than 40° C. and not higher than 100° C.

The pressing-heating process hot-presses the graphite formed in the sheet-like form in the thickness direction of the sheet. This enables the fibrous graphite to be more appropriately oriented. This also improves the shape stability and the intensity of the graphite sheet member.

The heating temperature in the pressing-heating process is, for example, not lower than 100° C. and not higher than 400° C. This effectively prevents the water, the binder and the like from being unintentionally left in the finally obtained graphite sheet member. The pressure applied in the pressure heating process is, for example, not lower than 10 MPa and not higher than 40 MPa.

When the scale-like graphite FG is compacted in the sheet-like form, the scale-like graphite FG is densely compacted to be hard in the vicinity of the surface of the graphite sheet member, while being roughly pressed to be relatively soft and to have voids in the vicinity of the center in the thickness direction of the graphite sheet member, as shown in FIG. 7.

The configuration that the thermal conducting portion-forming member 10' has voids inside thereof or more specifically in the vicinity of the center in the thickness direction enables the hardening resin material 21' to enter the voids inside of the thermal conducting portion-forming member 10' and further improves, for example, the adhesiveness of the thermal conducting portions 10 and the joint portions 20 in the thermal conductor 1 manufactured and the durability of the thermal conductor 1.

The overall density of the graphite sheet member is preferably not lower than 0.3 g/cm$^3$ and not higher than 2.1 g/cm$^3$, is more preferably not lower than 0.6 g/cm$^3$ and not higher than 1.8 g/cm$^3$, and is furthermore preferably not lower than 0.9 g/cm$^3$ and not higher than 1.5 g/cm$^3$.

This improves the thermal conductivity and the intensity especially in the planar direction of the graphite sheet member alone.

Examples of the graphite sheet member satisfying such conditions include GraFoil (manufactured by NeoGraf Solutions, LLC), PERMA-FOIL (manufactured by Toyo Tanso Co., Ltd.), carbon sheet (manufactured by TYK Corporation), PGS graphite sheet (manufactured by Panasonic Corporation), and Grafinity (manufactured by KANEKA Corporation).

2-1-1-2. Metal Sheet Member

The metal sheet member used may include components other than a metal material, for example, a binder and a resin fiber, in addition to the metal material. It is, however, preferable that the metal sheet member is substantially made of only the metal material, i.e., is substantially composed of a single component.

For example, a metal foil obtained by rolling the metal material to a sheet-like form is preferably used as the metal sheet member.

Examples of the metal material constituting the metal sheet member include a variety of single metals and alloys. The metal material may be one or a combination of two or more selected among these examples. The metal material preferably includes one metal or two or more metals selected from the group consisting of Al, Cu, Ag, Au, Mg and Zn.

This configuration further improves the thermal conductivity of the thermal conducting portions 10 formed.

2-1-1-3. Carbon Fibers

The carbon fibers constituting the thermal conducting portion-forming member 10' may be, for example, pitch-based carbon fibers and PAN-based carbon fibers. The pitch-based carbon fibers are, however, preferable.

The pitch-based carbon fibers may be, for example, isotropic pitch-based carbon fibers and mesophase pitch-based carbon fibers. The mesophase pitch-based carbon fibers are, however, preferable.

The carbon fibers may include graphite.

The thickness of the carbon fibers (in the case where the thermal conducting portion-forming member 10' includes a fiber bundle, the thickness of single fibers constituting the fiber bundle) is not specifically limited but is preferably not less than 1 μm and not greater than 20 μm, is more preferably not less than 3 μm and not greater than 15 μm, and is furthermore preferably not less than 5 μm and not greater than 12 μm.

This configuration makes the advantageous effects described above more prominent.

When the thermal conducting portion-forming member 10' includes a fiber bundle extended in its longitudinal direction, the thickness of the fiber bundle (fiber bundle of carbon fibers) is preferably not less than 1.0 mm and not greater than 30 mm, is more preferably not less than 1.5 mm and not greater than 20 mm, and is furthermore preferably not less than 2.0 mm and not greater than 15 mm.

This configuration makes the advantageous effects described above more prominent. Furthermore, this configuration enhances the ease in handling of the thermal conducting portion-forming member 10' and advantageously improves the productivity of the thermal conductor 1.

2-2. Joint Portion-Forming Composition Providing Process

The joint portion-forming composition providing process provides the joint portion-forming composition 20' that is used to form the joint portions 20.

2-2-1. Joint Portion-Forming Composition

The joint portion-forming composition 20' used in the joint portion-forming composition adhesion process is supposed to form the joint portions 20 in the thermal conductor 1 and is a composition including the hardening resin material 21'.

The hardening resin material 21' is not specifically limited as long as the resin material 21 obtained by curing the hardening resin material 21' has flexibility. The hardening resin material 21' used may be a precursor of the resin material 21 described above, for example, an uncured body or a semi-cured body. This has the similar advantageous effects to those described above.

It is preferable that the hardening resin material 21' generates a gas in a curing process described later.

This enables the voids 2 to be appropriately formed in the thermal conductor 1.

The joint portion-forming composition 20' may include, for example, metal particles, ceramic particles, a spacer or the like.

This allows for formation of the joint portions 20 including such components and has the advantageous effects described above.

When the joint portion-forming composition 20' includes these components, it is preferable to adjust the content rate of these components in the joint portion-forming composition 20', such that the content rate of these components in the joint portions 20 of the finally obtained thermal conductor 1 is a value in the range described above.

The joint portion-forming composition 20' may include components other than those described above.

Examples of such components include plasticizers, coloring agents, antioxidants, ultraviolet absorbers, light stabilizers, softeners, modifiers, rust inhibitors, filling agents, electromagnetic wave absorption materials such as ferrite, surface lubricants, corrosion inhibitors, heat-resistant stabilizers, lubricants, primers, antistatic agents, polymerization inhibitors, cross-linking agents, catalysts, leveling agents, thickening agent, dispersing agents, anti-aging agents, flame retardants, hydrolysis inhibitors, and corrosion preventive agents.

The content rate of these components in the joint portion-forming composition 20' is preferably not higher than 5% by weight, is more preferably not higher than 3% by weight, and is furthermore preferably not higher than 1% by weight.

It is preferable that the joint portion-forming composition 20' does not include a solvent component. This configuration prevents the solvent component from unintentionally remaining in the finally obtained thermal conductor 1 and further enhances the reliability of the thermal conductor 1.

2-3. Joint Portion-Forming Composition Adhesion Process

The joint portion-forming composition adhesion process causes the joint portion-forming composition 20' that is used to form the joint portions 20, to adhere to the surface of the thermal conducting portion-forming member 10'.

According to the embodiment, the joint portion-forming composition 20' includes the hardening resin material 21'.

A method employable to make the joint portion-forming composition 20' adhere to the surface of the thermal conducting portion-forming member 10' may be, for example, any of various coating methods, a transfer method or a dipping method. More concretely, the employable method may be a coating method using, for example, any of a bar coater, a roll coater, a reverse roll coater, a gravure coater, a die coater, a kiss coater, a rod coater, a dip coater, and a spray coater.

This enables the joint portion-forming composition 20' to continuously and appropriately adhere to the surface of the thermal conducting portion-forming member 10' and is advantageous in improving the reliability of the thermal conductor 1 manufactured and the productivity of the thermal conductor 1.

This process may be performed by, for example, using an apparatus (dip coater) shown in FIG. 8. More specifically, this process provides a raw material roll R1 by winding in a roll form the thermal conducting portion-forming member 10' produced in advance. The thermal conducting portion-forming member 10' as the raw material is drawn out from the raw material roll R1 and is guided and conveyed by guide rolls R3. The thermal conducting portion-forming member is then dipped in a liquid receiving tank M which stores, for example, the joint portion-forming composition 20' in a liquid form. This causes the joint portion-forming composition 20' in the liquid receiving tank M to adhere to the surface of the thermal conducting portion-forming member 10'.

Using the dip coater enables the joint portion-forming composition 20' to adhere to the respective surfaces of the thermal conducting portion-forming member 10'. Thereby allows for continuous and efficient adhesion of the joint portion-forming composition 20' in the adhesion process.

In the joint portion-forming composition adhesion process, it is preferable to include air bubbles between the thermal conducting portion-forming member and the joint portion-forming composition 20'.

This enables the voids 2 to be appropriately formed between the thermal conducting portions 10 and the joint portions 20 after the resin material 21 is cured.

A method employable to include air bubbles between the thermal conducting portion-forming member 10' and the joint portion-forming composition 20' includes, for example, adjustment of the surface shape of the thermal conducting portion-forming member 10', the viscosity of the joint portion-forming composition 20' and the wettability to the thermal conducting portion-forming member 10' and adjustment of the pitch, the winding speed and the like in traverse winding of the long thermal conducting portion-forming member 10' in the winding process described later.

A gas generated during a curing reaction after adhesion of the joint portion-forming composition 20' to the thermal conducting portion-forming member 10' may be used to form the air bubbles (to form the voids 2).

It is preferable to perform this process by using the heated joint portion-forming composition 20' such that the viscosity of the joint portion-forming composition 20' becomes lower than the viscosity at room temperature (20° C.).

This configuration enables the joint portion-forming composition 20' to more appropriately adhere to the thermal conducting portion-forming member in this process, and causes the joint portion-forming composition 20' adhering to the thermal conducting portion-forming member 10' to be cooled down after completion of this process, for example, in the winding process, and to have a viscosity lower than the viscosity in this process. As a result, this effectively prevents the joint portion-forming composition 20' adhering to the thermal conducting portion-forming member 10' from unintentionally coming off in a process after the joint portion-forming composition adhesion process. This configuration also effectively prevents the air bubbles as described above from being unintentionally lost in a subsequent process (for example, by pressing in the winding process) and more reliably provides the thermal conductor 1 with the voids 2 suitably formed.

The heating temperature of the joint portion-forming composition 20' in this process is not specifically limited but is preferably set such that the viscosity of the joint portion-forming composition 20' satisfies the following condition.

In the process of making the joint portion-forming composition 20' adhere to the thermal conducting portion-forming member 10', the viscosity of the joint portion-forming composition 20' is preferably not lower than 500 mPa·s and not higher than 50000 mPa·s, is more preferably not lower than 1500 mPa·s and not higher than 45000 mPa·s, and is furthermore preferably not lower than 2000 mPa·s and not higher than 40000 mPa·s.

This configuration enables the joint portion-forming composition 20' to more appropriately adhere to the thermal conducting portion-forming member by a predetermined thickness and at a predetermined proportion. This configuration also enables air bubbles to be more appropriately included between the thermal conducting portion-forming member 10' and the joint portion-forming composition 20'.

The viscosity of the joint portion-forming composition 20' may be determined by measurement in conformity with JIS Z8803:2011.

This process may use, for example, multiple different joint portion-forming compositions 20' or may use a material including only one part of the constituent components of the joint portion-forming composition 20' described above and a material including another part of the constituent components in combination. More specifically, for example, this process may use the joint portion-forming composition 20' that includes the hardening resin material 21 but does not include the spacer and may give the spacer to the thermal conducting portion-forming member 10' with the joint portion-forming composition 20' adhering thereto between this process and the winding process.

2-4. Winding Process

The winding process winds the thermal conducting portion-forming member 10' with the joint portion-forming composition 20' adhering thereto, on the peripheral surface of the wind-up roll R2 by traverse winding, so as to obtain a wound body 30 in a tubular shape.

2-4-1. Traverse Winding

FIG. 9A and FIG. 9B are diagrams schematically illustrating the states of traverse winding employed according to the present disclosure. Each of FIG. 9A and FIG. 9B illustrates an example of traverse winding in two different direction.

FIG. 9A and FIG. 9B only illustrate only the thermal conducting portion-forming member 10' with omission of the joint portion-forming composition 20'.

As shown in FIG. 9A, in the state of a first winding layer (first layer) on the wind-up roll R2, the thermal conducting portion-forming member 10' with the joint portion-forming composition 20' adhering to the surface thereof is wound on the wind-up roll R2 in a direction shown by an arrow D1 in an attitude inclined to the wind-up roll R2. More specifically, the thermal conducting portion-forming member 10' is wound in an attitude inclined in a direction d1 that is a positive direction by an angle θ3 relative to a vertical line v perpendicular to a center axis c of the wind-up roll R2.

The thermal conducting portion-forming member 10' is wound, for example, from one end in a longitudinal direction of the wind-up roll R2 toward another end by traverse winding. It is, however, not necessary to start winding from one end, but winding may start at a location in the vicinity of the center in the longitudinal direction of the wind-up roll R2.

A known method may be employed for the method of winding the thermal conducting portion-forming member 10' in such a manner. For example, an employed method may feed the thermal conducting portion-forming member 10' in a fixed direction and turn the wind-up roll R2 to appropriately change the winding angle. According to the embodiment, in the process of winding the thermal conducting portion-forming member 10' on the wind-up roll R2, it is preferable to maintain a gap $g_1$ between adjacent winding pieces of the thermal conducting portion-forming member 10'. Traverse winding with maintaining the gap more effectively suppresses a distortion of the thermal conducting portion-forming member 10'. Furthermore, traverse winding with maintaining the gap effectively suppresses disturbance of winding of the thermal conducting portion-forming member 10' on a lower side (on a side closer to the wind-up roll R2) in the case of winding by two or more winding layers.

The winding method employed is, for example, a method of traverse winding by fixing the wind-up roll R2 and swinging a non-illustrated guide configured to guide the conveyance of the thermal conducting portion-forming member 10' or a method of traverse winding by fixing the guide and swinging the wind-up roll R2.

In the case where the thermal conducting portion-forming member 10' has a belt-like form (flat shape), the method of traverse winding by swinging the wind-up roll R2 is preferable. Traverse winding with swinging the wind-up roll R2 enables the belt-like form (flat shape) to be more readily maintained. Furthermore, it is preferable to wind the thermal conducting portion-forming member 10' in such a manner as not to distort the thermal conducting portion-forming member 10'.

According to the embodiment, the gap $g_1$ in traverse winding of the thermal conducting portion-forming member 10' is preferably not less than 20 μm and not greater than 2000 μm, is more preferably not less than 30 μm and not greater than 1500 μm, and is furthermore preferably not less than 40 μm and not greater than 1000 μm.

This configuration ensures the sufficiently high proportion of the thermal conducting portions 10 occupied in the thermal conductor 1 manufactured and provides the thermal conductor 1 with the higher overall flexibility. This configuration thus makes the advantageous effects of the present disclosure described above more prominent. Additionally, this configuration effectively suppresses the thermal conducting portion-forming member 10' from slipping off or being disturbed in the process of manufacturing the thermal conductor 1.

As shown in FIG. 9B, in the state of a second winding layer (second layer) on the wind-up roll R2, the thermal conducting portion-forming member 10' is wound in a direction shown by an arrow D2 in an attitude inclined in a direction d2 that is a negative direction by an angle θ4 relative to the vertical line v perpendicular to the center axis c of the wind-up roll R2. Accordingly, the direction d2 of inclination relative to the vertical line v is opposite to the direction d1 of inclination in the first winding layer.

This configuration more effectively prevents the thermal conducting portion-forming member 10' from being unintentionally moved (shifted) in the process of manufacturing the thermal conductor 1 and enables the thermal conductor 1 of a desired configuration to be readily and reliably manufactured. Additionally, for example, even when a relatively large load is applied to the thermal conductor 1 manufactured, this configuration more effectively suppresses irreversible deformation of the thermal conductor 1, for example, collapse of the thermal conductor 1 due to buckling or the like, and improves the durability of the thermal conductor 1. Furthermore, when the thermal conductor 1 is compressed in the first direction, this configuration causes a surface pressure to be more readily applied to the thermal conductor 1 and further enhances the adhesiveness between the thermal conductor 1 and the member which the thermal conductor 1 is applied to. Moreover, the pressure applied to the thermal conductor 1 in the first direction includes a component of force in a direction of pressing the thermal conducting portions 10 against the joint portions 20. This configuration accordingly enhances the adhesiveness between the thermal conducting portions 10 and the joint portions 20.

In the second winding layer, the thermal conducting portion-forming member 10' is also wound such as to maintain a gap $g_2$ between adjacent winding pieces of the thermal conducting portion-forming member 10'.

The gap $g_2$ in traverse winding of the second winding layer may be identical with or may be different from the gap $g_1$ in the first winding layer (first layer). The preferable range of the gap $g_2$ is identical with that of the gap $g_1$.

The absolute values of the angles θ3 and θ4 in traverse winding are preferably not less than 0.3° and not greater than 20°, are more preferably not less than 0.5° and not greater than 10°, and are furthermore preferably not less than 0.7° and not greater than 10°.

This configuration more effectively suppresses distortion when the thermal conducting portion-forming member 10' is folded back at the end of the winding roll R2. This configuration also enables the values of θ1 and θ2 (the angles between the normal direction of the surface and the extending direction of the penetrating thermal conducting portions 10c) to be readily adjusted to values in the range described above in the finally obtained thermal conductor 1 and thereby more definitely achieves the advantageous effects described above.

The angle in traverse winding may not be a strict numerical value in a mathematical meaning but may include an ordinary error in the technical field of the present disclosure. For example, an angle having a difference of less than 1° is regarded as traverse winding in an identical direction including the difference as an error.

The winding speed in traverse winding of the thermal conducting portion-forming member 10' is not specifically limited but is preferably not lower than 1.0 m/minute and not higher than 100 m/minute, is more preferably not lower than 1.5 m/minute and not higher than 50.0 m/minute, and is furthermore preferably not lower than 2.0 m/minute and not higher than 15.0 m/minute.

This ensures appropriate traverse winding while suppressing distortion of the thermal conducting portion-forming member 10', and also enables the amount of adhesion of the joint portion-forming composition 20' to be more appropriately and more readily controlled. This configuration also enables air bubbles to be more appropriately included between the thermal conducting portion-forming member 10' and the joint portion-forming composition 20' and enables the voids 2 to be more appropriately formed in the thermal conductor 1 after the resin material 21 is cured.

The winding tension in traverse winding of the thermal conducting portion-forming member 10' is not specifically limited but is preferably not lower than 1 N and not higher than 100 N, is more preferably not lower than 5 N and not higher than 50 N, and is furthermore preferably not lower than 5 N and not higher than 20 N.

This ensures appropriate traverse winding while suppressing distortion of the thermal conducting portion-forming member 10', and also enables the amount of adhesion of the joint portion-forming composition 20' to be more appropriately and more readily controlled. This configuration also enables air bubbles to be more appropriately included between the thermal conducting portion-forming member 10' and the joint portion-forming composition 20' and enables the voids 2 to be more appropriately formed in the thermal conductor 1 after the resin material 21 is cured.

The winding process may wind one piece of the thermal conducting portion-forming member 10' (the thermal conducting portion-forming member 10' with the joint portion-forming composition 20' adhering thereto) on the peripheral roll of one wind-up roll R2. It is, however, preferable that the winding process winds multiple pieces of the thermal conducting portion-forming member 10' with the joint portion-forming composition 20' adhering thereto, on the peripheral surface of one wind-up roll R2, so as to obtain one wound body 30.

The winding process arranges multiple pieces of the thermal conducting portion-forming member 10' with the joint portion-forming composition 20' adhering thereto, along a longitudinal direction of one wind-up roll R2. More specifically, the winding process divides the peripheral surface of the wind-up roll R2 into a plurality of areas in the longitudinal direction and winds each piece of the thermal conducting portion-forming member 10' on the peripheral surface of each area by traverse winding.

The area where one piece of the thermal conducting portion-forming member 10' is wound may partly overlap with the area where an adjacent piece of the thermal conducting portion-forming member 10' is wound.

This configuration suppresses distortion of the thermal conducting portion-forming member 10' wound by traverse winding, enables the wound body to be obtained with the higher efficiency, and further improves the productivity of the thermal conductor 1, without expanding the size of the apparatus. Furthermore, this configuration more effectively suppresses the occurrence of a characteristic difference between individuals with regard to multiple thermal conductors 1 manufactured in one identical lot.

The wound body thus obtained has a configuration that parts comprised of the thermal conducting portion-forming member 10' and parts comprised of the joint portion-forming composition 20' are alternately arranged from the center toward the outer circumference of the wound body 30.

FIG. 8 illustrates the configuration that the thermal conducting portion-forming member 10' is guided and conveyed by the guide rolls R3. The thermal conducting portion-forming member 10' may, however, be conveyed by non-illustrated guide roll(s) other than the guide rolls R3. The conveying direction of the thermal conducting portion-forming member 10' may be changed by the guide roll(s) as needed basis.

The diameter of the wind-up roll R2 which the thermal conducting portion-forming member 10' with the joint portion-forming composition 20' adhering thereto is wound on, is not specifically limited but is preferably not less than 10 cm and not greater than 100 cm and is more preferably not less than 20 cm and not greater than 60 cm.

This ensures more appropriate traverse winding, while suppressing distortion of the thermal conducting portion-forming member 10'. Furthermore, this configuration enables the wound body 30 to be obtained with the higher efficiency, while suppressing distortion in a cut body 40 caused by a difference in curvature between an inner circumference and an outer circumference of the wound body 30 when the wound body 30 is cut-open to the cut body 40 in the subsequent cutting process.

In the illustrated configuration, the thermal conducting portion-forming member 10' with the joint portion-forming composition 20' adhering thereto is wound on the peripheral surface of the wind-up roll 2 having a cross section in a perfect circular shape. This is, however, not essential, but the thermal conducting portion-forming member 10' may be wound on a peripheral surface of a roll having a cross section in an elliptical shape, in a polygonal shape, or in an oval track shape.

In the case where the joint portions 20 are formed to include the fibrous base material described previously, the winding process may wind the fibrous base material along with the thermal conducting portion-forming member 10' described above, on the wind-up roll R2.

In this case, the fibrous base material may be provided by giving the joint portion-forming composition 20' thereto by a method similar to that described above or may be provided without giving the joint portion-forming composition 20'.

In the case of using the fibrous base material with the joint portion-forming composition 20' given thereto, the thermal conducting portion-forming member 10' used may be that with the joint portion-forming composition 20' given thereto as described above or may be that without the joint portion-forming composition 20' given thereto. In other words, the joint portion-forming composition adhesion process may cause the joint portion-forming composition to adhere to the fibrous base material, in place of the thermal conducting portion-forming member 10'.

In the case of using the fibrous base material, an adhesive may be applied on at least part of the surface thereof.

2-5. Cutting Process

The cutting process cuts-open the wound body 30 in a direction that is not perpendicular to an axial direction of the wind-up roll R2, so as to obtain the cut body 40.

Cutting the wound body 30 prior to the curing process of curing the hardening resin material 21' enables the softer body to be cut, compared with the joint portions 20 including the resin material 21 that is a cured body of the hardening resin material 21'.

This process makes a cut in the direction that is not perpendicular to the axial direction of the wind-up roll R2 in the cylindrical shape from one end to the other end in the axial direction of the wind-up roll R2 along the winding direction of the wound body 30, cuts open the wound body 30 at the position of the cut, and detaches the cut-open body from the wind-up roll R2, so as to obtain a cut body 40.

The cutting direction of the wound body 30 is required to be the direction that is not perpendicular to the axial direction of the wind-up roll R2 but is otherwise not specified, and may be, for example, a direction approximately parallel to the axial direction of the wind-up roll or a direction diagonal to the axial direction of the roll. The wound body 30 may include portions that are cut-open in different directions. For example, the wound body 30 may have a portion that is cut-open in the direction approximately parallel to the axial direction of the wind-up roll R2 and a portion that is cut-open in the direction diagonal to the axial direction of the roll.

The cutting method of the wound body 30 is not specifically limited but may be a method using, for example, a band saw, a saw, a cutter, a trimming cutter, a laser, an ultrasonic cutter, a water cutter or the like.

2-6. Curing Process

A curing process cures the hardening resin material 21' included in the joint portion-forming composition 20' in the cut body 40.

According to the embodiment, the curing process of curing the hardening resin material 21' included in the cut body 40 is performed after the cutting process.

As shown in FIG. 10, at the time when the wound body 30 is cut-open to the cut body 40, the cut body 40 is generally curved. In the case where the hardening resin material 21' is cured prior to cutting of the wound body 30, increasing the flatness of the curved cut body 40 causes distortion due to the difference in curvature between the inner circumference and the outer circumference of the cut body 40 and is likely to cause separation and reduction of the adhesion between the thermal conducting portions 10 and the joint portions 20, breakage of the joint portions 20, and destruction of the joint between the thermal conducting portions 10. The process of curing the hardening resin material 21' in the cut body 40 that is obtained by cutting-open the wound body 30 to have the increased flatness, on the other hand, effectively prevents the occurrence of the problems described above.

This process cures the hardening resin material 21', for example, in the state that an inner circumferential side and an outer circumferential side of the cut body 40 are respectively brought into contact with planes.

More specifically, as shown in FIG. 11, this process cures the hardening resin material 21' to the resin material 21 in the state that a pressure is applied to the cut body 40 by placing the cut body 40 between two flat plates 90 so as to increase the flatness of the thermal conducting portions 10 and the joint portions 20.

The pressure applied is not specifically limited but is preferably higher than 0 MPa and not higher than 100 MPa, is more preferably not lower than 1 MPa and not higher than 80 MPa, and is furthermore preferably not lower than MPa and not higher than 50 MPa.

Application of the pressure lower the above lower limit value is likely to make it difficult to sufficiently enhance the flatness of the thermal conducting portions 10 and the joint portions 20. Application of the pressure higher than the above upper limit value, on the other hand, causes the hardening resin material 21' to significantly come off between adjacent pieces of the thermal conducting portion-forming member 10' and is likely to make it difficult to form the joint portions 20 of a desired thickness. This also causes the air bubbles included between the thermal conducting portion-forming member 10' and the joint portion-forming composition 20' to be crushed, and causes the gas generated in the process of curing the hardening resin material 21' to be released. This is likely to make it difficult to appropriately form the voids 2 in the thermal conductor 1 after curing of the resin material 21.

The curing process performed with application of the pressure to the cut body 40 more effectively prevents, for example, the separation and the reduction of the adhesion between the thermal conducting portions 10 and the joint portions 20, the breakage of the joint portions 20, and the destruction of the joint between the thermal conducting portions 10, and further improves the durability of the thermal conductor 1.

In the case where the hardening resin material 21' is a thermosetting resin, the heating temperature differs depending on the conditions of the hardening resin material 21' and the like but is preferably not lower than 80° C. and not higher than 220° C. and is more preferably not lower than 100° C. and not higher than 190° C.

This enables the hardening resin material 21' to be cured more appropriately.

The thermal conductor 1 is obtained through the respective processes described above and additional processing to a predetermined shape as needed basis.

2-7. Slicing Process

In the case where the thermal conductor 1 is to be manufactured in a sheet-like form, a slicing process of slicing the cured body to a sheet-like form having the thermal conducting portions 10 and the joint portions 20 exposed on the respective surfaces is performed after the curing process described above.

This enables, for example, the thermal conductor 1 in the sheet-like form having a desired thickness to be obtained.

After the curing process, the cured body is sliced, for example, along a cutting line C-C' and a cutting line D-D' shown in FIG. 12. This provides the thermal conductor 1 of a sheet-like form having a thickness $T_3$.

Even when the thermal conductor 1 of the sheet-like form to be manufactured has a relatively small thickness $T_3$, the thermal conductor 1 can be readily sliced since the curing process cures the hardening resin material 21' to the resin material 21 having the higher shape stability.

The method of slicing is not specifically limited but may be a method using, for example, a cutter, a trimming cutter, a laser, an ultrasonic cutter or a water cutter.

The direction of sliding may be approximately parallel to the thickness direction of the cut body 40 or may be a direction diagonal to the thickness direction of the cut body 40. It is, however, preferable that the direction of slicing is the direction diagonal to the thickness direction of the cut body 40.

This configuration enables the values of θ1 and θ2 (the angles between the normal direction of the surface and the extending direction of the penetrating thermal conducting portions 10c) to be readily adjusted to values in the range described above in the finally obtained thermal conductor 1 and thereby more definitely achieves the advantageous effects described above.

The absolute value of an angle between the direction of slicing and the thickness direction of the cut body 40 is preferably not less than 2° and not greater than 45°, is more preferably not less than 3° and not greater than 40°, and is furthermore preferably not less than 4° and not greater than 35°.

This makes the advantageous effects described above more prominent.

The direction of slicing is not specifically limited but is preferably a direction that is approximately parallel to the winding direction (the axial direction of the wind-up roll R2). More specifically, the absolute value of an angle between the direction of slicing and the winding direction (the axial direction of the wind-up roll R2) is preferably not less than 0° and not greater than 10°, is more preferably not less than 0° and not greater than 7°, and is furthermore preferably not less than 0° and not greater than 5°.

A surface of the thermal conductor 1 or more specifically a surface where the thermal conducting portions 10 and the joint portions 20 are exposed may be subjected to a polishing process. This enables the surface roughness of the thermal conductor 1 to be appropriately adjusted.

A surface roughness Ra of the thermal conductor 1 in the natural state is preferably not lower than 0.1 μm and not higher than 80 μm, is more preferably not lower than 0.1 μm and not higher than 30 μm, and is furthermore preferably not lower than 0.1 μm and not higher than 10 μm.

This configuration enables the thermal conductor 1 to more suitably follow the surface profile of the member which the thermal conductor 1 is applied to, and further improves the actual thermal conductivity between the member and the thermal conductor 1.

The surface roughness Ra of the thermal conductor 1 may be measured by, for example, a method in conformity with JIS B 0601-2013.

3. Applications of Thermal Conductor

The following describes applications of the thermal conductor 1.

Figure 13:
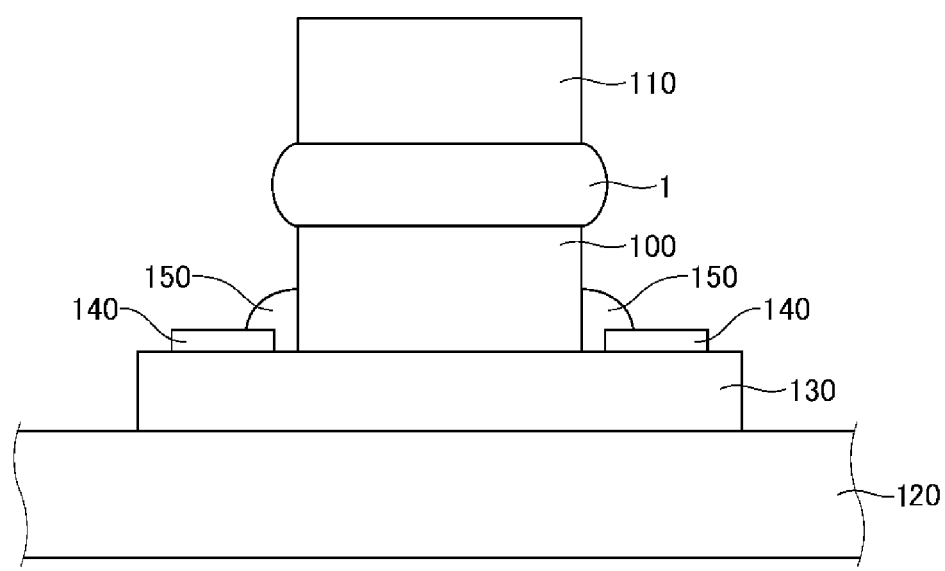
FIG. 13 is a diagram schematically illustrating one example of application of the thermal conductor shown in FIG. 5.
Figure 14:
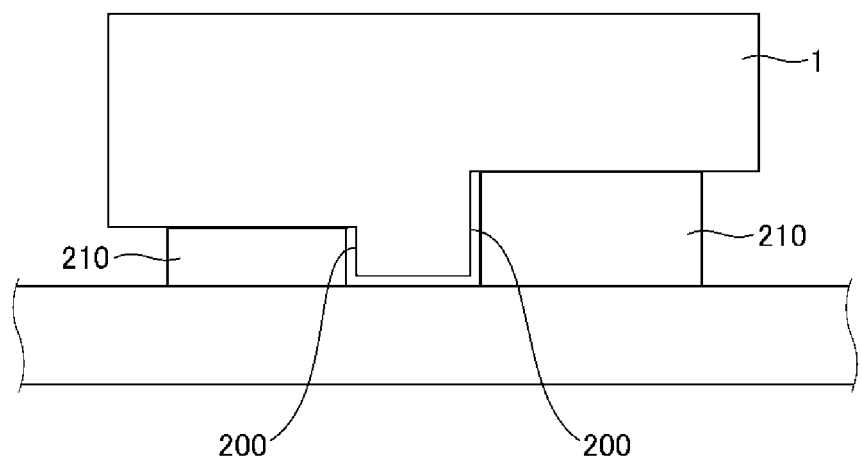
FIG. 14 is a diagram schematically illustrating another example of application of the thermal conductor shown in FIG. 5.
Figure 15:
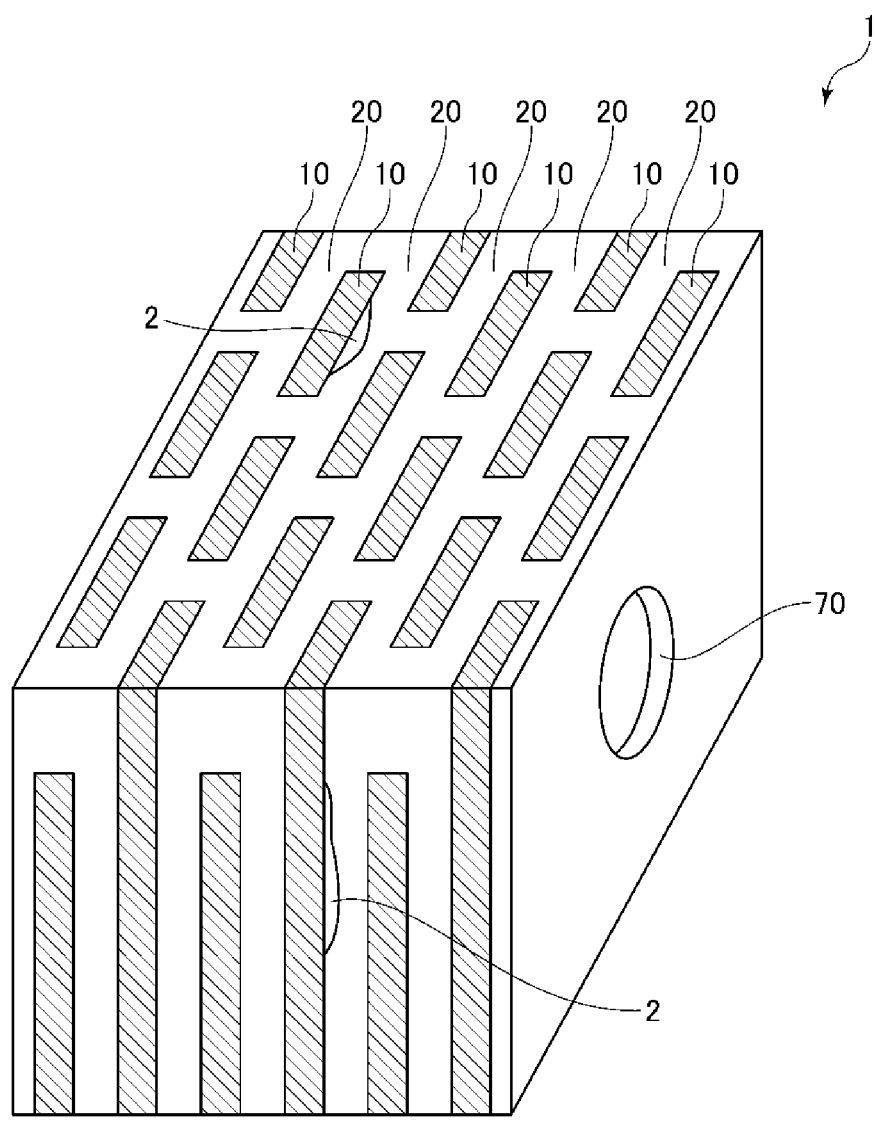
FIG. 15 is a diagram schematically illustrating one example of application of the thermal conductor shown in FIG. 1.
Figure 16:
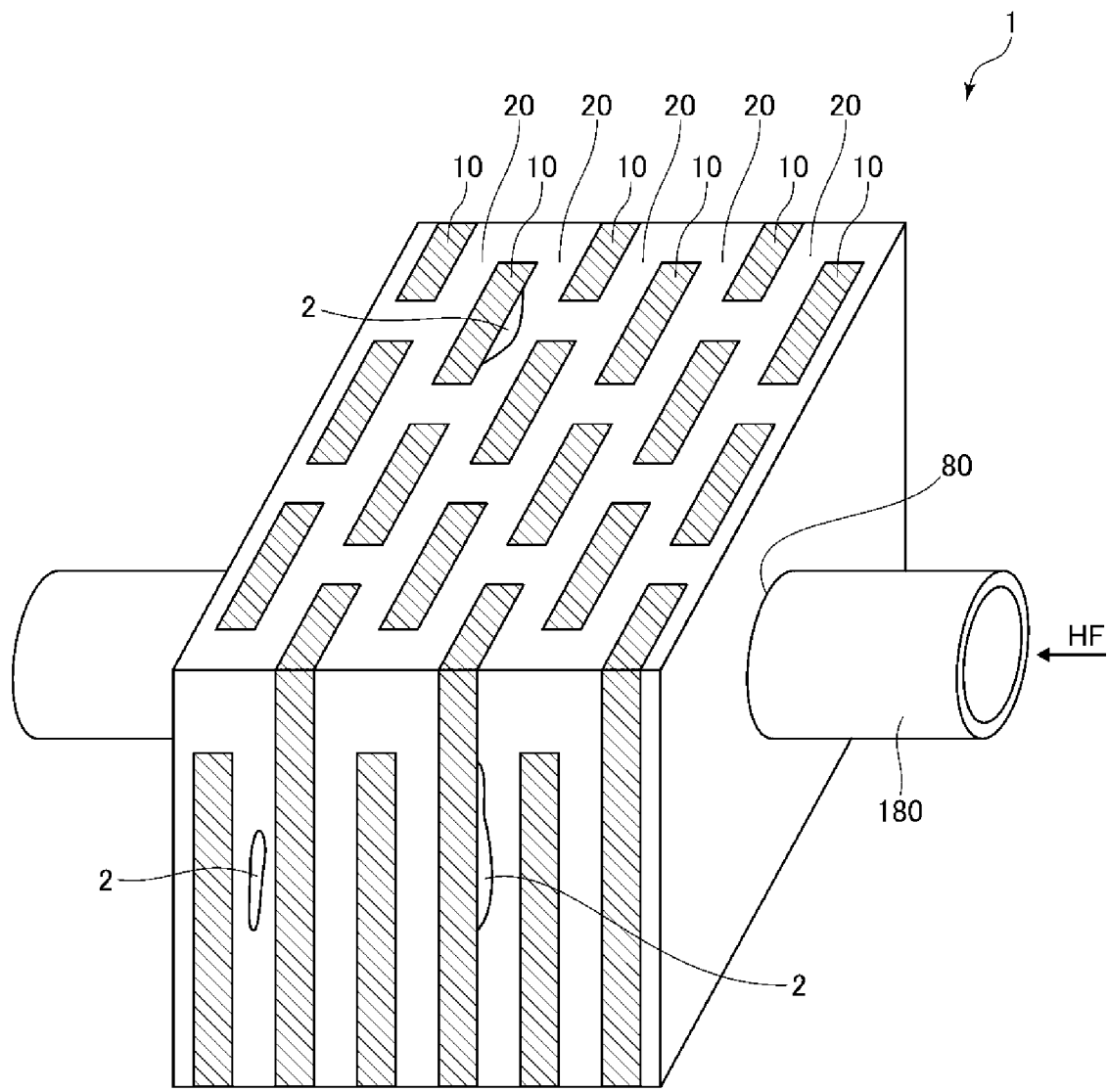
FIG. 16 is a diagram schematically illustrating another example of application of the thermal conductor shown in FIG. 1.

FIG. 13 is a diagram schematically illustrating one example of application of the thermal conductor shown in FIG. 5. FIG. 14 is a diagram schematically illustrating another example of application of the thermal conductor shown in FIG. 5. FIG. 15 is a diagram schematically illustrating one example of application of the thermal conductor shown in FIG. 1. FIG. 16 is a diagram schematically illustrating another example of application of the thermal conductor shown in FIG. 1.

The thermal conductor 1 is used, for example, as some of various heat release members. Alternatively, the thermal conductor 1, for example, is used as a heat transfer member brought into contact with a high temperature member and a heat release member and configured to transmit the heat of the high temperature member to the heat release member and thereby efficiently release the heat from the heat release member. Besides, the thermal conductor 1 is used, for example, as a heat transfer member brought into contact with a heating object to be heated and a high temperature member having a higher temperature than that of the heating object and configured to transmit the heat energy from the high temperature member to the heating object and thereby efficiently heat the heating object.

As described above, the shape of the thermal conductor 1 is not specifically limited but may be, for example, a block-like form as shown in FIG. 1 or a sheet-like form as shown in FIG. 5 according to the application of the thermal conductor 1 and the like.

The following mainly describes an application of the thermal conductor 1 used in contact with at least part of the surface of a high temperature member that is a heat generating element.

The high temperature member is not specifically limited but may be any member having a higher temperature than the ambient atmosphere. The high temperature member may be, for example, various electronic components and electric components or more specifically a central processing unit (CPU) of a computer, an arithmetic processor for image processing (GPU), a power device, an FPGA, an ASIC, an SoC of a smartphone, a DSP and a microcomputer of an embedded device, a semiconductor element such as a transistor, a laser diode, a luminous body such as a light emitting diode (LED), electroluminescence or liquid crystal, a CCD, an imaging element such as an image sensor (for example, 8K), a switching regulator, a motor coil, or a printer head. The high temperature member may also be, for example, a relay, a battery, a transformer, a power supply unit, a bearing, an electron gun, a vacuum tube, or a high frequency transmitter. The high temperature member may also be, for example, a tube or a container having a high temperature fluid placed inside thereof.

The maximum temperature of the surface of the high temperature member is preferably not lower than 40° C. and not higher than 250° C., is more preferably not lower than 50° C. and not higher than 200° C., and is furthermore preferably not lower than 60° C. and not higher than 180° C.

Application of the thermal conductor 1 to such a high temperature member ensures more effective heat transfer and heat release and makes the advantageous effects of the present disclosure more prominent.

FIG. 13 illustrates an application of the thermal conductor 1 of the sheet-like form to a central processing unit.

A die of a central processing unit 100 is provided on a substrate 130 of a motherboard 120, and wiring 140 (first cache) is provided at a location other than the location where the die is placed, on the substrate 130. The wiring 140 is protected by an underfill 150. The application range of the underfill 150 is a range of approximately 1 mm in width from an outer circumference of the die, and part of the wirings 140 is exposed.

The thermal conductor 1 of the sheet-like form is placed between and is thermally connected with the central processing unit 100 as a high temperature member that is a heat generating element and a cooling fin 110 that is a heat release member. The thermal conductor 1 is placed between the central processing unit 100 and the cooling fin 110 in the state that the thermal conductor 1 is pressed, for example, by a pressure of approximately 0.2 MPa.

As described above, the thermal conductor 1 is made of a material having high thermal conductivity and has high flexibility and good shape compatibility to the surfaces of the high temperature member and the heat release member. Accordingly, even when the surfaces of the high temperature member and the heat release member have relatively large irregularities or the like, this enables the thermal conductor 1 to be suitably in close contact with these members. This reduces the interfacial thermal resistance and enhances the actual thermal conductivity from the high temperature member to the thermal conductor 1.

This configuration enables the heat from the central processing unit 100 that is the high temperature member to be effectively released. This suppresses the occurrence of a heat-induced trouble such as a failure or a malfunction of the central processing unit 100 and extends the product life of the central processing unit 100.

Furthermore, the thermal conductor 1 of the present disclosure has the voids 2 and thereby suppresses excessive deformation when the thermal conductor 1 is pressed. This effectively prevents the occurrence of a problem such as an electrical short circuit of an electronic circuit due to the contact of the extruded part of the pressed thermal conductor 1 with the exposed wiring 140.

The thermal conductor 1 may be processed by step processing to form a stepped portion 200, for example, on a surface opposed to the high temperature member.

The step processing is performed, for example, according to the surface profile of the high temperature member which the thermal conductor 1 is applied to.

This enables the thermal conductor 1 to be more reliably in contact with even a member, for example, a high temperature member having a complicated surface profile, and is suitably used as a TIM (thermal interface material) applied to cool down such a member.

The member having the complicated surface profile is, for example, a CCD, an LED, or a small sensor module.

For example, in the case where the thermal conductor 1 is used to cool down a plurality of high temperature members (members 210) mounted on a substrate (placed across a plurality of high temperature members (members 210) in use), it is preferable that a face of the thermal conductor 1 opposed to these high temperature members is processed by step processing corresponding to a surface profile including the surfaces of the plurality of high temperature members.

This configuration enables these plurality of high temperature members to be cooled down simultaneously and appropriately.

As shown in FIG. 14, in the case where the thermal conductor 1 is applied to a member including a plurality of components, a difference in level may be formed such that the thermal conductor 1 comes into contact with part of the components, for example, high temperature members (members 210) such as electronic components but does not come into contact with the other part of the components, for example, a non-high temperature components such as a substrate.

The timing of the stepping process, i.e., the timing of formation of the stepped portions 200 is not specifically limited. For example, the stepped portions 200 may be formed in the manufacturing process of the thermal conductor 1 or may be formed by a user or the like after manufacture of the thermal conductor 1.

The thermal conductor 1 may have a bottomed recess 70 as shown in FIG. 15. For example, a non-illustrated high temperature member may be placed in the bottomed recess 70 in use.

The timing of formation of the bottomed recess 70 is not specifically limited. For example, the bottomed recess 70 may be formed in the manufacturing process of the thermal conductor 1 or may be formed by a user or the like after manufacture of the thermal conductor 1.

In the configuration shown in FIG. 15, the bottomed recess 70 which the high temperature member is placed in has its depth direction corresponding to the X direction of the thermal conductor 1 shown in FIG. 1. The direction of the bottomed recess 70 is, however, not limited to this configuration.

In the configuration shown in FIG. 15, the high temperature member which the thermal conductor 1 is applied to is, for example, a micromotor, a high-intensity LED unit, a sensor heat generating part, or a CCD camera unit.

The thermal conductor 1 may be brought into contact with a non-illustrated heat release member on an outer surface of the thermal conductor 1 or more specifically on a surface where the thermal conducting portions 10 and the joint portions 20 are exposed.

This configuration further improves the efficiency of heat release from the high temperature member.

The thermal conductor 1 has high flexibility and accordingly enables an inner surface of the bottomed recess 70 to be deformed and more suitably follow the surface profile of the high temperature member placed in the bottomed recess 70. This ensures the sufficient adhesiveness.

The size of the bottomed recess 70 is not specifically limited. It is, however, preferable that the width of the bottomed recess 70 (the diameter when the bottomed recess 70 has a circular shape) in the natural state that no member is placed in the bottomed recess 70 and that no external force is applied to the bottomed recess 70 is smaller than the width of the member placed in the bottomed recess 70.

This configuration further enhances the adhesiveness between the thermal conductor 1 and the member placed in the bottomed recess 70 and makes the advantageous effects described above more prominent.

The bottomed recess 70 may be a slit and more specifically, may be substantially closed in the natural state that no member is placed in the bottomed recess 70 and that no external force is applied to the bottomed recess 70.

The thermal conductor 1 may have a hole 80 that is a penetrating recess as shown in FIG. 16. In this case, for example, a high temperature member is inserted through the hole 80 in use. FIG. 16 illustrates a configuration that a tubular body 180 as a high temperature member is inserted through the hole 80 in use.

For example, in the case where a high temperature fluid HF is present inside of the tubular body 180, the insertion of the tubular body 180 as the high temperature member through the hole 80 in use not only cools down the tubular body 180 but efficiently cools down the high temperature fluid HF via the tubular body 180 and the thermal conductor 1. Accordingly, in the configuration shown in FIG. 16, the high temperature member to be cooled down is regarded as both the tubular body 180 and the high temperature fluid HF. In other words, even the high temperature fluid HF that does not directly come into contact with the thermal conductor 1 can be efficiently cooled down by the thermal conductor 1.

The timing of formation of the hole 80 is not specifically limited. For example, the hole 80 may be formed in the manufacturing process of the thermal conductor 1 or may be formed by a user or the like after manufacture of the thermal conductor 1.

In the configuration shown in FIG. 16, the hole 80 which the high temperature member is inserted through is formed in a direction corresponding to the X direction of the thermal conductor 1 shown in FIG. 1. The direction of the hole 80 is, however, not limited to this configuration.

The thermal conductor 1 may be brought into contact with a non-illustrated heat release member on an outer surface of the thermal conductor 1 or more specifically on a surface where the thermal conducting portions 10 and the joint portions 20 are exposed.

This configuration further improves the efficiency of heat release from the high temperature member.

The thermal conductor 1 has high flexibility and accordingly enables an inner peripheral surface of the hole 80 to be deformed and more suitably follow the surface profile of the tubular body 180 inserted through the hole 80. This ensures the sufficient adhesiveness.

The size of the hole 80 is not specifically limited. It is, however, preferable that the width of the hole 80 (the diameter when the hole 80 has a circular shape) in the natural state that no member is inserted through the hole 80 and that no external force is applied to the hole 80 is smaller than the width of the member inserted through the hole 80 (the outer diameter when the member has a cylindrical shape or a columnar shape).

This configuration further enhances the adhesiveness between the thermal conductor 1 and the member inserted through the hole 80 and makes the advantageous effects described above more prominent.

The hole 80 may be a slit and more specifically, may be substantially closed in the natural state that no member is inserted through the hole 80 and that no external force is applied to the hole 80.

The thermal conductor of the present disclosure described above may be applied to an electronic equipment. This electronic equipment includes, for example, an electronic component and a heat release member or the thermal conductor of the present disclosure serving as a heat transfer member as described above.

The electronic equipment which the thermal conductor of the present disclosure is applied to is, for example, a small electronic equipment.

Examples of the small electric equipment include laptop computers, tablet terminals, mobile communication terminals, mobile phones, smartp hones, portable music players, portable radios, portable television sets, digital cameras, video cameras, portable game equipment, electronic book readers, and portable medical equipment.

Such an electronic equipment includes a thermal conductor of excellent actual thermal conduction to efficiently release the heat from the electronic component as a heat generating member and effectively reduce the risks of life reduction, malfunction and the like of a device or a system. The electronic equipment also includes a thermal conductor configured to suppress excessive deformation when the thermal conductor is pressed. This prevents, for example, a failure caused by a short circuit of wiring of the electronic component and further enhances the reliability of the electronic equipment.

Especially, with further high integration and high speed of the electronic components, mobile communication terminals for the fifth-generation mobile communication using the higher frequency electronic waves tend to have larger amounts of heat generation. The thermal conductor of the present disclosure is thus appropriately applied to such mobile communication terminals. This makes the advantageous effects described above more prominent.

The foregoing describes the preferred embodiments of the present disclosure. The present disclosure is, however, not limited to these embodiments.

For example, the manufacturing process of the thermal conductor may further include other processes (for example, a pretreatment process, an intermediate treatment process and a posttreatment process), in addition to the processes described above.

In the manufacturing method of the thermal conductor, the sequence of at least part of the processes described above may be changed.

According to one aspect of the manufacturing method of the thermal conductor of the present disclosure, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a thermal conducting portion-forming member that is used to form the thermal conducting portions; and a joint portion-forming composition adhesion process of making a joint portion-forming composition that is used to form the joint portions, adhere to a surface of the thermal conducting portion-forming member, wherein the thermal conductor has voids where neither the thermal conducting portion nor the joint portion is present, and wherein when an area of the thermal conductor in a planar view in a first direction is expressed by S0 [$cm^2$] and an area of the thermal conductor in the planar view in the first direction in a pressed state that the thermal conductor is pressed by 0.2 MPa in the first direction is expressed by S1 [$cm^2$], the thermal conductor to be manufactured satisfies a condition of $0.5 \leq [(S1-S0)/S0] \times 100 \leq 20$. According to another aspect, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a long thermal conducting portion-forming member that is used to form the thermal conducting portions; a joint portion-forming composition adhesion process of making a joint portion-forming composition that is used to form the joint portions, adhere to a surface of the thermal conducting portion-forming member; a winding process of winding the thermal conducting portion-forming member with the joint portion-forming composition adhering thereto, on a peripheral surface of a roll by traverse winding to obtain a wound body in a tubular shape; and a cutting process of cutting open the wound body in a direction that is not perpendicular to an axial direction of the roll to obtain a cut body. The manufacturing method of the thermal conductor according to the present disclosure may not simultaneously satisfy conditions of these two methods.

More specifically, for example, as long as the method manufactures the thermal conductor satisfying the condition of $0.5 \leq [(S1-S0)/S0] \times 100 \leq 20$, the method may wind the thermal conducting portion-forming member with the joint portion-forming composition adhering thereto by a winding technique other than traverse winding, for example, flat winding or may stack sheets of the thermal conducting portion-forming member with the joint portion-forming composition adhering thereto to form a stacked body with omitting the cutting process.

The thermal conductor according to the present disclosure comprises a plurality of thermal conducting portions; and joint portions made of a material having flexibility and configured to join the respective thermal conducting portions with each other, has voids where neither the thermal conducting portion nor the joint portion is present, and has a value of $[(S1-S0)/S0] \times 100$ in a predetermined range. This thermal conductor may be manufactured by any method.

The foregoing mainly describes the thermal conductor having a planar rectangular shape. The shape of the thermal conductor may, however, be appropriately determined, for example, according to the profile of a member that is brought into contact with the thermal conductor.

The foregoing mainly describes the thermal conducting portions and the joint portions in the planar shape constituting the thermal conductor. At least part of the thermal conducting portions and the joint portions constituting the thermal conductor may, however, be in a non-planar shape, for example, in a curved shape or in a belt shape.

The thermal conductor may include a component other than the thermal conducting portions, the joint portions and the voids described above.

EXAMPLES

The following describes the present disclosure in detail with reference to Examples and Comparative Examples, although the present disclosure is not limited to these examples.

The processes were performed at 20° C., unless another temperature condition is specified.

4. Manufacture of Thermal Conductor

Thermal conductors of respective Examples and Comparative Examples were manufactured by a procedure described below.

Example 1

The procedure provided a long graphite sheet member having a thickness of 127 μm and a width of 19 mm and having scale-like graphite oriented along a thickness direction of the graphite sheet member, as the long (tape-like) thermal conducting portion-forming member, and provided a solvent-free one-component elastomer material, SeRM elastomer, as the joint portion-forming composition.

The graphite sheet member used in this example had the scale-like graphite densely compacted in the vicinity of the surface thereof and had relatively many voids in the vicinity of the center in the thickness direction of the graphite sheet member. The density of the graphite sheet member was 1.1 g/cm$^3$. The thermal conductivity in an in-plane direction of the graphite sheet member at 20° C. measured by a transient hot wire method in conformity with JIS R 2616-2000 was 160 W/(m·K). The graphite sheet member used in this example had a belt like form having irregularities on a main surface thereof. The surface roughness in maximum height Rz of the graphite sheet member measured by a method in conformity with JIS B 0601-2013 was 70 μm.

The SeRM elastomer used as the joint portion-forming composition in this example includes a polyrotaxane including cyclic molecules, a first polymer having a linear molecular structure and including the cyclic molecules in a skewered manner, and blocking groups provided in the vicinity of respective ends of the first polymer; and a second polymer, and is configured such that the polyrotaxane and the second polymer are combined with each other via the cyclic molecules.

The procedure subsequently used an apparatus as shown in FIG. 8 to make the joint portion-forming composition adhere to the respective surfaces of the thermal conducting portion-forming members by a dip coater. The joint portion-forming composition made to adhere to the thermal conducting portion-forming member was heated to 50° C. and was regulated to have the viscosity of 3000 mPa·s.

The procedure then wound the thermal conducting portion-forming member with the joint portion-forming composition adhering thereto, on a peripheral surface of a wind-up roll having a diameter of 20 cm and a length of 20 cm under application of a tension of 10 N at a speed of 2 m/minute by traverse winding, so as to obtain a wound body.

More specifically, the procedure arranged ten thermal conducting portion-forming members (thermal conducting portion-forming members with the joint portion-forming composition adhering thereto) at equal intervals of 1 mm in a length direction of the wind-up roll in a state that the thermal conducting portion-forming members were inclined by 2° relative to an axis of the wind-up roll, and wound the thermal conducting portion-forming members with inverting the direction of inclination (to a positive direction and to a negative direction) with respect to each winding layer. The angle of inclination of the thermal conducting portion-forming members was equalized in the positive direction and in the negative direction relative to the axis of the wind-up roll. The temperature of the thermal conducting portion-forming members (thermal conducting portion-forming members with the joint portion-forming composition adhering thereto) in traverse winding was regulated to be 30° C.

The procedure subsequently made a cut parallel to the axial direction of the wind-up roll with a cutter to cut-open the wound body and detached the cut-open body from the wind-up roll, so as to obtain a cut body. The cut body obtained was curved in the natural state. The curvature of an inner peripheral surface of the cut body, i.e., the curvature of a surface in contact with the wind-up roll, was, however, smaller than the curvature of the wound body in contact with the wind-up roll. The cut body accordingly had the higher flatness than the wound body.

The procedure then placed the obtained cut body between two flat plates and pressed the cut body by 20 MPa for one hour with heating the cut body to 120° C. The cut body was placed, such that an entire portion corresponding to an outer peripheral surface of the wound body was brought into contact with one flat plate, whereas an entire portion corresponding to an inner peripheral surface of the wound body was brought into contact with the other flat plate.

The procedure subsequently increased the heating temperature to 180° C. while keeping this pressed state and performed heating treatment for 12 hours to cure the hardening resin material constituting the joint portion-forming composition and obtain a thermal conductor. The two surfaces of the obtained thermal conductor that were in contact with the flat plates were both flat surfaces and parallel to each other even after the thermal conductor was released from the pressed state.

The procedure subsequently cut the thermal conductor to a thickness of 1.0 mm at an angle of 30° between a slicing direction and a thickness direction of the cut body and along a direction parallel to the axial direction of the wind-up roll, subsequently cut the thermal conductor of 1.0 mm in thickness to a square shape of 40 mm×40 mm, and polished respective main surfaces of the cut pieces by using sandpaper, so as to obtain a plurality of thermal conductors in a sheet-like form as shown in FIG. 5 for various measurements and for various evaluations described later.

The thermal conductor of the sheet-like form thus obtained included a plurality of thermal conducting portions and joint portions and had the thermal conducting portions and the joint portions exposed on respective main surfaces thereof as shown in FIG. 5. The thermal conducting portions were made of graphite, and the joint portions were made of the resin material having flexibility. The thermal conductor also had voids where neither the thermal conducting portion nor the joint portion was present, in locations adjacent to the joint portions. The voids were formed by air bubbles of the air taken in between the thermal conducting portion-forming member and the joint portion-forming composition in the winding process and by a gas generated in a curing reaction of the SeRM elastomer.

The thermal conductor had a plurality of thermal conducting portions arranged in stagger in a planar view from a top face. At least part of the plurality of thermal conducting portions were penetrating thermal conducting portions that were continuously provided inside of the thermal conductor and that were exposed on a pair of two parallel surfaces.

In the thermal conductor, the thickness of the thermal conducting portions formed from the thermal conducting portion-forming member was 127 μm, and the thickness of the joint portions made of the resin material was 85 μm. The interval between the adjacent thermal conducting portions was 1 mm.

The proportion of the thermal conducting portions occupied in the thermal conductor was 60% by volume, the proportion of the joint portions occupied in the thermal conductor was 33% by volume, and the proportion of the voids occupied in the thermal conductor was 7% by volume.

When the proportion of the thermal conducting portions occupied in the thermal conductor was expressed by VC [% by volume], the proportion of the joint portions occupied in the thermal conductor was expressed by VJ [% by volume] and the proportion of the voids occupied in the thermal conductor was expressed by VV [% by volume], the value of [(VJ+VV)/(VC+VJ+VV)]×100 was 40.

The viscosity of the thermal conductor in the natural state was 1.1 g/cm$^3$.

The surface roughness Ra measured with regard to the respective main surfaces of the thermal conductor by the method in conformity with JIS B 0601-2013 was 1.5 μm for both the main surfaces.

Examples 2 to 6

Thermal conductors of a sheet-like form were manufactured similarly to that of Example 1 described above, except the conditions of the thermal conducting portion-forming member, the conditions of the joint portion-forming composition and the winding conditions were changed as specified in Table 1.

Example 7

A thermal conductor of a sheet-like form was manufactured similarly to that of Example 1 described above, except that a fiber bundle of mesophase pitch-based carbon fibers was used in place of the graphite sheet for the thermal conducting portion-forming member and that the winding speed was changed.

The fiber bundle of the carbon fibers used in this example had the thickness of 100 μm and the width of 19 mm. The thickness of the carbon fiber in the fiber bundle was 8 μm.

Comparative Examples 1 and 2

Thermal conductors of a sheet-like form were manufactured similarly to that of Example 1 described above, except the conditions of the thermal conducting portion-forming member and the conditions of the joint portion-forming composition were changed as specified in Table 1.

Comparative Example 3

In this comparative example, a commercially available graphite sheet member, GraFoil (manufactured by NeoGraf Solutions, LLC), was cut into a square shape of 40 mm×40 mm and was used as a thermal conductive sheet.

The thermal conductor of this comparative example accordingly had no joint portions.

The graphite sheet member used in this Comparative Example had the thickness of 127 μm and had scale-like graphite oriented along a thickness direction of the graphite sheet member. The graphite sheet member had the scale-like graphite densely compacted in the vicinity of the surface thereof and had relatively many voids in the vicinity of the center in the thickness direction of the graphite sheet member. The density of the graphite sheet member was 1.1 g/cm$^3$. The thermal conductivity in the in-plane direction of the graphite sheet member at 20° C. measured by the transient hot wire method in conformity with JIS R 2616-2000 was 160 W/(ma).

The manufacturing conditions of the thermal conductors of the respective examples and of the respective comparative examples described above and the configurations of the thermal conductors are summarized in Table 1. Table 1 also shows the values of [S1−S0)/S0]×100, [(S3−S4)/S3]×100, and [(S1'−S0)/S0]×100, when the area of the thermal conductor in the natural state in a planar view from a top face side (in a first direction) is expressed by S0 [cm$^2$], the area of the thermal conductor in the planar view from the top face side (in the first direction) in a pressed state that the thermal conductor was pressed by 0.2 MPa from the top face side (in the first direction) is expressed by S1 [cm$^2$], the area of the thermal conductor in the natural state observed from a lateral face side (in a second direction) is expressed by S3 [cm$^2$], the area of the thermal conductor observed from the lateral face side (in the second direction) in the pressed state that the thermal conductor was pressed by 0.2 MPa from the top face side (in the first direction) is expressed by S4 [cm$^2$], and the area of the thermal conductor in the planar view in the first direction in a pressed state that the thermal conductor was pressed by a predetermined pressure from the top face side (in the first direction) to have a compression rate of 20% in the thickness direction is expressed by S1' [cm$^2$]. The values of S3 and S4 employed here were average values of areas observed in one side direction (in an x direction) of the square and areas observed in a direction perpendicular to the one side (in a y direction).

Table 1

TABLE 1

| | | Manufacturing Conditions of Thermal Conductor | | | | | |
|---|---|---|---|---|---|---|---|
| | | Thermal Conducting Portion-Forming Member | | | Joint Portion-Forming Composition | | Winding Conditions | |
| | | Constituent: Material | Thickness [μm] | Width [mm] | Constituent Material | Viscosity [mPa·s] | Winding Tension [N] | Winding Speed [n/minute] |
| Ex 1 | | Graphite Sheet | 127 | 19 | SeRM Elastomer | 3000 | 10 | 2 |
| Ex 2 | | Graphite Sheet | 50 | 19 | SeRM Elastomer | 3000 | 10 | 2 |

TABLE 1-continued

| | | | | | | | |
|---|---|---|---|---|---|---|---|
| Ex 3 | Graphite Sheet | 100 | 4 | SeRM Elastomer | 3000 | 10 | 2 |
| Ex 4 | Graphite Sheet | 75 | 9 | SeRM Elastomer | 3000 | 10 | 2 |
| Ex 5 | Graphite Sheet | 32 | 9 | SeRM Elastomer | 3000 | 10 | 2 |
| Ex 6 | Graphite Sheet | 17 | 9 | SeRM Elastomer | 3000 | 10 | 2 |
| Ex 7 | Carbon Fiber | 100 | 19 | SeRM Elastomer | 3000 | 10 | 3 |
| Comp Ex 1 | Graphite Sheet | 127 | 9 | SeRM Elastomer | 3000 | 20 | 2 |
| Comp Ex 2 | Graphite Sheet | 50 | 4 | SeRM Elastomer | 3000 | 5 | 2 |
| Comp Ex 3 | Graphite Sheet | 127 | — | — | — | — | — |

| | Configuration of Thermal Conductor, etc | | | | | | |
|---|---|---|---|---|---|---|---|
| | Proportions Occupied in Thermal Conductor | | | Angle between Normal Direction of Main Surface of Thermal Conductor and Extending Direction of Penetrating Thermal Conducting Portions [°] | | | |
| | Thermal Conducting Portions VC [% by volume] | Joint Portions VJ [% by volume] | Voids VV [% by volume] | | $[(S1 - S0)/S0] \times 100$ | $[(S3 - S4)/S3] \times 100$ | $[(S1' - S0)/S0] \times 100$ |
| Ex 1 | 60 | 33 | 7 | 30 | 0.5 | 6 | 12 |
| Ex 2 | 45 | 45 | 10 | 30 | 5 | 8 | 10 |
| Ex 3 | 55 | 28 | 17 | 5 | 10 | 15 | 12 |
| Ex 4 | 50 | 30 | 20 | 30 | 10 | 20 | 10 |
| Ex 5 | 41 | 37 | 12 | 30 | 5 | 10 | 12 |
| Ex 6 | 27 | 58 | 15 | 30 | 10 | 13 | 15 |
| Ex 7 | 55 | 20 | 25 | 30 | 20 | 47 | 9 |
| Comp Ex 1 | 62 | 35 | 3 | 5 | 0.4 | 3 | — |
| Comp Ex 2 | 27 | 18 | 55 | 30 | 22 | 55 | 9 |
| Comp Ex 3 | 100 | — | — | — | 0 | 0.1 | — |

5. Evaluations

The thermal conductors of the sheet-like form of the respective examples and of the respective comparative examples obtained as described above were evaluated as described below.

5-1. Actual Thermal Conductivity in Pressed State

Each of the thermal conductors was subjected to shape adjustment to a square of 10 mm×10 mm. The thermal conductivity in the first direction was measured by a method in conformity with US Standard ASTM D5470 in the state that the thermal conductor was pressed by 0.2 MPa in the first direction (in the thickness direction). A heater was controlled, such that the temperatures of an upper surface and a lower surface of the thermal conductor in measurement were approximately 50° C.

5-2. Measurement of Thermal Conductivity by Unsteady Method

The thermal conductivity was measured by a transient hot wire method in conformity with a laser flash method in the state that a location to be measured in each of the thermal conductors was subjected to carbon spraying of mm in diameter.

5-3. Evaluation of Prevention of Short Circuit

A motherboard with a CPU of a large-scale server for business use mounted thereon was provided.

A die of the CPU was provided on a substrate of the motherboard, and wiring (first cache) was provided at a location other than the location where the die was placed, on the substrate. Part of the wiring was not covered with an underfill but was exposed.

The substrate had the dimensions of 40 mm×28 mm, and the die had the dimensions of 16 mm×14 mm and the thickness of 0.14 mm.

The thermal conductor subjected to shape adjustment to a rectangle of 40 mm×28 mm was placed on the CPU, and a cooling fin was fixed to the thermal conductor.

The thermal conductor placed between the die and the cooling fin was in the pressed state by a pressure of 0.2 MPa.

A power was then supplied, and evaluation was made for the occurrence or no occurrence of an electrical short circuit of the wiring provided on the substrate by an extruded part of the thermal conductor.

A: no occurrence of an electric short circuit of wiring

B: occurrence of an electric short circuit of wiring 5-4. Evaluation of Durability The value of L1/L0 was determined, and each of the thermal conductors was evaluated according to criteria given below, where the length (thickness) of the thermal conductor in an initial state (in the natural state) in a thickness direction (in the first direction) is expressed by L0 [mm] and the length of the thermal conductor in the first direction when an operation of pressing the thermal conductor in the first direction by 1.0 MPa for one minute and releasing the thermal conductor from the pressed state to leave the thermal conductor in the released state for one minute was repeated 1000 number of times is expressed by L1 [mm]. The larger value of L0/L1 indicates the higher curability.

A: The value of L1/L0 is not lower than 0.90.
B: The value of L1/L0 is not lower than 0.80 and is lower than 0.90.
C: The value of L1/L0 is not lower than 0.70 and is lower than 0.80.
D: The value of L1/L0 is lower than 0.70.

These results are shown in Table 2.

Table 2

TABLE 2

|  | Actual Thermal Conductivity in Pressed State W/(m · K) | Thermal Conductivity by Unsteady method W/(m · K) | Prevention of Short Circuit | Durability |
| --- | --- | --- | --- | --- |
| Ex 1 | 50 | 120 | A | C |
| Ex 2 | 45 | 80 | A | C |
| Ex 3 | 75 | 110 | A | B |
| Ex 4 | 70 | 100 | A | A |
| Ex 5 | 45 | 80 | A | B |
| Ex 6 | 35 | 65 | A | B |
| Ex 7 | 60 | 80 | A | A |
| Comp Ex 1 | 15 | 120 | A | D |
| Comp Ex 2 | 30 | 60 | B | D |
| Comp Ex 3 | 1 | 5 | A | D |

As clearly shown in Table 2, each of the thermal conductors of the respective examples, i.e., the thermal conductor according to the present disclosure, had high actual thermal conductivity, suppressed the excessive deformation in the pressed state, and effectively prevented the occurrence of a problem such as an electrical short circuit. The thermal conductor according to the present disclosure also had high durability. The thermal conductors of the respective comparative examples, on the other hand, had no satisfactory results.

INDUSTRIAL APPLICABILITY

According to one aspect of the present disclosure, there is provided a thermal conductor comprising a plurality of thermal conducting portions; and joint portions made of a material having flexibility and configured to join the respective thermal conducting portions with each other, having voids where neither the thermal conducting portion nor the joint portion is present, and satisfying a condition of $0.5 \leq [(S1-S0)/S0] \times 100 \leq 20$ when an area of the thermal conductor in a planar view in a first direction is expressed by S0 [cm$^2$] and an area of the thermal conductor in the planar view in the first direction in a pressed state that the thermal conductor is pressed by 0.2 MPa in the first direction is expressed by S1 [cm$^2$]. Accordingly, this provides a thermal conductor that satisfies both ensuring the adhesiveness to a member in contact with the thermal conductor in use and suppressing an excessive deformation of the thermal conductor in a compressed state. According to another aspect of the present disclosure, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a thermal conducting portion-forming member that is used to form the thermal conducting portions; and a joint portion-forming composition adhesion process of making a joint portion-forming composition that is used to form the joint portions, adhere to a surface of the thermal conducting portion-forming member, wherein the thermal conductor has voids where neither the thermal conducting portion nor the joint portion is present, and wherein when an area of the thermal conductor in a planar view in a first direction is expressed by S0 [cm$^2$] and an area of the thermal conductor in the planar view in the first direction in a pressed state that the thermal conductor is pressed by 0.2 MPa in the first direction is expressed by S1 [cm$^2$], the thermal conductor to be manufactured satisfies a condition of $0.5 \leq [(S1-S0)/S0] \times 100 \leq 20$. Accordingly, this provides a manufacturing method of a thermal conductor that manufactures, with high efficiency, a thermal conductor that satisfies both ensuring the adhesiveness to a member in contact with the thermal conductor in use and suppressing an excessive deformation of the thermal conductor in a compressed state. According to another aspect of the present disclosure, there is provided a manufacturing method of a thermal conductor comprising a plurality of thermal conducting portions; and joint portions configured to join the respective thermal conducting portions with each other. The manufacturing method of the thermal conductor comprises a thermal conducting portion-forming member providing process of providing a long thermal conducting portion-forming member that is used to form the thermal conducting portions; a joint portion-forming composition adhesion process of making a joint portion-forming composition that is used to form the joint portions, adhere to a surface of the thermal conducting portion-forming member; a winding process of winding the thermal conducting portion-forming member with the joint portion-forming composition adhering thereto, on a peripheral surface of a roll by traverse winding to obtain a wound body in a tubular shape; and a cutting process of cutting open the wound body in a direction that is not perpendicular to an axial direction of the roll to obtain a cut body. Accordingly, this provides a manufacturing method of a thermal conductor that manufactures, with high efficiency, a thermal conductor that satisfies both ensuring the adhesiveness to a member in contact with the thermal conductor in use and suppressing an excessive deformation of the thermal conductor in a compressed state. The thermal conductor and the manufacturing method of the thermal conductor according to the present disclosure have industrial applicability.

REFERENCE SIGNS LIST 1 thermal conductor
2 void
10 thermal conducting portion
10*a* first line
10*b* second line
10*c* penetrating thermal conducting portion 10' thermal conducting portion-forming member
20 joint portion
20' joint portion-forming composition
21 resin material
21' hardening resin material
30 wound body
40 cut body
50 polyrotaxane
51 cyclic molecule
52 first polymer
53 blocking group
60 second polymer
70 bottomed recess
80 hole
90 flat plate
100 central processing unit
110 cooling fin
120 motherboard
130 substrate
140 wiring
150 underfill
180 tubular body
200 stepped portion
210 member
FG scale-like graphite
HF high temperature fluid
R1 material roll
R2 wind-up roll
R3 guide roll
M liquid receiving tank
$t_{10}$ thickness
$t_2$ thickness
$w_{10}$ width
$g_{10}$ interval
L0 length
L1 length
$T_1$ thickness
$T_2$ thickness
$T_3$ thickness
S0 area
S1 area
S3 area
S4 area
θ1 angle
θ2 angle
θ3 angle
θ4 angle
A-A' cutting line
B-B' cutting line
C-C' cutting line
D-D' cutting line
c center axis
D1 arrow
D2 arrow
d1 direction
d2 direction
$e_{10}$ extending direction
$g_1$ gap
$g_2$ gap
v vertical line
V1 normal direction

The invention claimed is:

1. A thermal conductor comprising a plurality of thermal conducting portions; and joint portions made of a material having flexibility and configured to join the respective thermal conducting portions with each other, the thermal conductor having voids where neither the thermal conducting portion nor the joint portion is present, and
the thermal conductor satisfying a condition of 0.5≤[(S1−S0)/S0]×100≤20 when an area of the thermal conductor in a planar view in a first direction is expressed by S0 [cm²] and an area of the thermal conductor in the planar view in the first direction in a pressed state that the thermal conductor is pressed by 0.2 MPa in the first direction is expressed by S1 [cm²].

2. The thermal conductor according to claim 1, the thermal conductor having a sheet-like form.

3. The thermal conductor according to claim 2, the thermal conductor having a thickness of not less than 0.15 mm and not greater than 20 mm.

4. The thermal conductor according to claim 1,
wherein at least part of the plurality of thermal conducting portions are provided to be continuous inside of the thermal conductor and are exposed on each of two different surfaces of the thermal conductor.

5. The thermal conductor according to claim 1,
the thermal conductor having at least a pair of parallel surfaces, wherein
at least part of the plurality of thermal conducting portions are penetrating thermal conducting portions that are provided to be continuous inside of the thermal conductor and that are exposed on each of the pair of parallel surfaces, and
an angle between a normal direction of the pair of parallel surfaces and an extending direction of the penetrating thermal conducting portions is not less than 3° and not greater than 45°.

6. The thermal conductor according to claim 1,
wherein a proportion of the thermal conducting portions occupied in the thermal conductor is not lower than 15% by volume and not higher than 80% by volume.

7. The thermal conductor according to claim 1,
wherein a proportion of the joint portions occupied in the thermal conductor is not lower than 15% by volume and not higher than 70% by volume.

8. The thermal conductor according to claim 1,
wherein a proportion of the voids occupied in the thermal conductor is not lower than 5% by volume and not higher than 65% by volume.

9. The thermal conductor according to claim 1,
the thermal conductor satisfying a relationship of 25≤[(VJ+VV)/(VC+VJ+VV)]×100≤90, when a proportion of the thermal conducting portions occupied in the thermal conductor is expressed by VC [% by volume], a proportion of the joint portions occupied in the thermal conductor is expressed by VJ [% by volume] and a proportion of the voids occupied in the thermal conductor is expressed by VV [% by volume].

10. The thermal conductor according to claim 1,
wherein the thermal conducting portions are made of a graphite-containing material.

11. The thermal conductor according to claim 1,
wherein the thermal conducting portions are substantially composed of a single component.

12. The thermal conductor according to claim 1,
wherein the plurality of thermal conducting portions are arranged in an island-like pattern in the planar view in the first direction.

13. The thermal conductor according to claim 12,
wherein the plurality of thermal conducting portions are arranged in stagger in the planar view in the first direction.

14. The thermal conductor according to claim 1,
wherein an interval between adjacent thermal conducting portions in the planar view in the first direction is not less than 1 μm and not greater than 200 μm.

15. The thermal conductor according to claim 1,
the thermal conductor having a density of not lower than 0.6 g/cm$^3$ and not higher than 2.5 g/cm$^3$ in a state prior to the pressed state.

16. The thermal conductor according to claim 1,
the thermal conductor satisfying a condition of $5 \leq [(S3-S4)/S3] \times 100 \leq 50$, when an area of the thermal conductor in the planar view in a second direction that is perpendicular to the first direction is expressed by S3 [cm$^2$] and an area of the thermal conductor observed in the second direction in the pressed state that the thermal conductor is pressed by 0.2 MPa in the first direction is expressed by S4 [cm$^2$].

17. The thermal conductor according to claim 1,
the thermal conductor satisfying a relationship of $0.70 \leq L1/L0$, when a length of the thermal conductor in the first direction in an initial state is expressed by L0 [mm] and a length of the thermal conductor in the first direction when an operation of pressing the thermal conductor in the first direction by 1.0 MPa for one minute and releasing the thermal conductor from the pressed state to leave the thermal conductor in the released state for one minute is repeated 1000 number of times is expressed by L1 [mm].

18. The thermal conductor according to claim 1,
the thermal conductor having an observed value of thermal conductivity in the first direction in the pressed state that the thermal conductor is pressed by 0.2 MPa in the first direction is not lower than 50 W/(m·K).

* * * * *